(12) United States Patent
Park et al.

(10) Patent No.: US 8,865,480 B2
(45) Date of Patent: Oct. 21, 2014

(54) CIRCUIT PROTECTION DEVICE AND METHOD OF MANUFACTURING THE SAME

(71) Applicant: Innochips Technology Co., Ltd., Ansan-Si (KR)

(72) Inventors: In-Kil Park, Yongin-Si (KR); Tae-Hyung Noh, Siheung-Si (KR); Kyu Cheol Jang, Hwaseong-Si (KR); Myung Ho Lee, Seoul (KR); Gyeong Tae Kim, Siheung-Si (KR); Sang Hwan Lee, Siheung-Si (KR)

(73) Assignee: Innochips Technology Co., Ltd. (KR)

( * ) Notice: Subject to any disclaimer, the term of this patent is extended or adjusted under 35 U.S.C. 154(b) by 0 days.

(21) Appl. No.: 13/936,131

(22) Filed: Jul. 5, 2013

(65) Prior Publication Data

US 2013/0295694 A1    Nov. 7, 2013

Related U.S. Application Data

(62) Division of application No. 12/594,599, filed as application No. PCT/KR2008/002035 on Apr. 10, 2008, now Pat. No. 8,493,704.

(30) Foreign Application Priority Data

Apr. 11, 2007  (KR) .......................... 10-2007-0035672
Apr. 11, 2007  (KR) .......................... 10-2007-0035674

(51) Int. Cl.
| | |
|---|---|
| *H01L 21/02* | (2006.01) |
| *H03H 7/42* | (2006.01) |
| *H01F 17/00* | (2006.01) |
| *H03H 1/00* | (2006.01) |
| *H03H 7/01* | (2006.01) |

(52) U.S. Cl.
CPC ............... *H01L 21/02* (2013.01); *H03H 7/427* (2013.01); *H03H 2001/0085* (2013.01); *H01F 17/0033* (2013.01); *H03H 7/0107* (2013.01)
USPC .............................................. 438/3; 438/104

(58) Field of Classification Search
None
See application file for complete search history.

(56) References Cited

U.S. PATENT DOCUMENTS

| | | | |
|---|---|---|---|
| 5,850,682 | A | 12/1998 | Ushiro |
| 6,054,914 | A | 4/2000 | Abel et al. |
| 6,133,809 | A | 10/2000 | Tomohiro et al. |
| 6,998,939 | B2 | 2/2006 | Nakayama et al. |
| 7,085,118 | B2 | 8/2006 | Inoue et al. |
| 7,652,554 | B2 | 1/2010 | Moriai et al. |
| 8,493,704 | B2 * | 7/2013 | Park et al. ................. 361/111 |
| 2006/0114634 | A1 | 6/2006 | Terada |
| 2006/0158301 | A1 | 7/2006 | Shinkai et al. |

FOREIGN PATENT DOCUMENTS

| | | |
|---|---|---|
| CN | 1279819 A | 1/2001 |
| CN | 1425183 A | 6/2003 |
| JP | 63100702 | 5/1988 |

(Continued)

*Primary Examiner* — Seahvosh Nikmanesh

(57) ABSTRACT

The present invention relates to a circuit protection device and a method of manufacturing the same. The circuit protection device includes a common mode noise filter having a plurality of sheets, each of the sheets being formed to optionally include a coil pattern, an internal electrode, a hole filled with a conductive material, and a hole filled with a magnetic material; and an electrostatic discharge (ESD) protection device having a plurality of sheets, each of the sheets being formed to optionally include an internal electrode and a hole filled with an ESD protection material.

10 Claims, 14 Drawing Sheets

500 (500a, 500b, 500c, 500d)
600 (600a, 600b)

(56) References Cited

FOREIGN PATENT DOCUMENTS

| | | |
|---|---|---|
| JP | 2503049 B2 | 7/1989 |
| JP | 2002329872 A | 11/2002 |
| JP | 2005026268 A | 1/2005 |
| JP | 2005044834 A | 2/2005 |
| JP | 2005150137 A | 6/2005 |
| JP | 2005229219 A | 8/2005 |
| JP | 2005229434 A | 8/2005 |
| JP | 2005295102 A | 10/2005 |
| JP | 2005341359 A | 12/2005 |
| JP | 2006080678 A | 3/2006 |
| JP | 2006210403 A | 8/2006 |
| JP | 2006294724 A | 10/2006 |
| JP | 2006295111 A | 10/2006 |
| JP | 2007081012 A | 3/2007 |
| KR | 20030007453 | 1/2003 |
| KR | 20040029592 A | 4/2004 |
| KR | 20050079149 A | 8/2005 |
| KR | 20060029258 A | 4/2006 |
| WO | 2005059928 A | 6/2005 |

\* cited by examiner 500 (500a, 500b, 500c, 500d, 500e, 500f, 500g, 500h)
600 (600a, 600b)

CIRCUIT PROTECTION DEVICE AND METHOD OF MANUFACTURING THE SAME

TECHNICAL FIELD

The present invention relates to a circuit protection device and a method of manufacturing the same, and more particularly, to a circuit protection device formed as a single composite device by laminating a solenoid-type common mode noise filter and an electro static discharge (hereinafter, referred to as "ESD") protection device, and a method of manufacturing the circuit protection device.

BACKGROUND ART

Recently, electronic devices such as mobile phones, home appliances, PCs, PDAs, LCDs and navigators have been gradually digitalized and operated at high speed. Because such electronic devices are sensitive to a stimulus from the outside, their circuits may be damaged or signals may be distorted when small abnormal voltages and high-frequency noises are introduced into internal circuits of the electronic devices from the outside.

Switching voltages generated in circuits, power noises contained in power voltages, unnecessary electromagnetic signals, electromagnetic noises, and the like cause such abnormal voltages and noises. A filter is used as a means for preventing such abnormal voltages and high-frequency noises from being introduced into a circuit.

In a general differential signal transmission system, in addition to common mode noise filters for eliminating common mode noises, passive components such as diodes and varistors should be separately used to prevent ESD that may be generated at input/output terminals. If the separate passive components are used at the input/output terminals to cope with ESD, a mounting area is broadened, manufacturing cost is increased, and signal distortion or the like is generated.

For example, in order to prevent ESD using a varistor, one end of the varistor is connected to an input/output terminal, and the other end of the varistor is connected to a ground terminal, and thereby electronic components in an electronic device are protected. However, the varistor functions as a capacitor in a normal operating state of an electronic device to which a transient voltage is not applied. Since capacitance of a capacitor is changed at a high frequency, signal distortion or the like may be generated when a varistor is used at a high-frequency or high-speed data input/output terminal or the like.

DISCLOSURE

Technical Problem

An aspect of the present invention is to provide a circuit protection device, wherein a common mode noise filter and an ESD protection device are implemented as a single composite device to solve the aforementioned problems, and a method of manufacturing the circuit protection device.

Another aspect of the present invention is to provide a circuit protection device implemented as a composite device by laminating and compressing: a common mode noise filter, in which holes filled with a magnetic material are formed in the center of a plurality of sheets and a coil pattern is formed around the holes; and an ESD protection device formed with holes filled with an ESD protection material to solve the aforementioned problems; and a method of manufacturing the circuit protection device.

Still another aspect of the present invention provides a circuit protection device implemented as a single composite device by laminating and compressing a common mode noise filter, which has a screw-thread-shaped coil surrounding a magnetic core formed by laminating magnetic layers formed on a plurality of sheets, and an ESD protection device which has an ESD protection material embedded in a plurality of sheets, and a method of manufacturing the circuit protection device.

Yet still another aspect of the present invention provides a circuit protection device implemented as a single composite device by laminating and compressing a common mode noise filter and an ESD protection device filled with ESD protection material, and a method of manufacturing the circuit protection device, in which a coil unit is manufactured by laminating a plurality of sheets and by connecting internal electrodes to each other through holes to be wound around magnetic layers and the coil unit is inserted into a coil unit insertion space of a coil insertion unit formed by laminating a plurality of sheets.

Technical Solution

According to an aspect of the present invention, there is provided a circuit protection device, which includes: a common mode noise filter having a plurality of sheets, each of the sheets being formed to optionally include a coil pattern, an internal electrode, a hole filled with a conductive material, and a hole filled with a magnetic material; and an ESD protection device having a plurality of sheets, each of the sheets being formed to optionally include an internal electrode and a hole filled with an ESD protection material.

The circuit protection device may further include an insulating sheet between the common mode noise filter and the ESD protection device, and upper and lower cover layers respectively formed on a top of the common mode noise filter and a bottom of the ESD protection device.

The circuit protection device may further include first external electrodes formed to be connected to some of the internal electrodes of the common mode noise filter and the ESD protection device; and second external electrodes formed to be connected to some of the internal electrodes of the ESD protection device, wherein the first external electrodes are connected between an input/output terminal and a circuit, and the second external electrodes are connected to a ground terminal.

The common mode noise filter may include a first sheet having a first hole filled with a magnetic material formed thereon; a second sheet having a first coil pattern, a first internal electrode, a first hole filled with a conductive material and a second hole filled with a magnetic material formed thereon; a third sheet having a second coil pattern, a second internal electrode, second and third holes filled with a conductive material and a third hole filled with a magnetic material formed thereon; and a fourth sheet having third and fourth internal electrodes, and a fourth hole filled with magnetic material formed thereon, wherein the first coil pattern is connected to the third internal electrode through the first and second holes filled with the conductive material, and the second coil pattern is connected to the fourth internal electrode through the third hole filled with the conductive material.

The common mode noise filter may include a first sheet having at least one first hole filled with a magnetic material; a second sheet in which at least one first coil pattern is formed from at least one first internal electrode exposed to an outside thereof to at least one first hole formed at a predetermined region to be filled with a conductive material, the first coil pattern surrounding at least one second hole filled with a magnetic material; a third sheet in which at least one second coil pattern is formed from at least one second internal electrode exposed to an outside thereof to at least one second hole formed at a predetermined region to be filled with a conductive material, wherein the second coil pattern surrounds at least one third hole filled with a magnetic material, and at least one third hole filled with a conductive material is formed to be spaced apart from the at least one second hole on the third sheet; and a fourth sheet in which a fourth hole filled with at least one magnetic material is formed, at least one third internal electrode which is connected to the first coil pattern through the first and third holes filled with the conductive material and exposed to an outside is formed, and at least one fourth internal electrode which is connected to the second coil pattern through the second hole filled with the conductive material and exposed to an outside is formed.

The first and second coil patterns may be formed in a spiral shape surrounding the first to the fourth holes filled with the magnetic material.

The sheets of the ESD protection device may include a first sheet having a plurality of first internal electrodes formed extending from a predetermined region to be exposed to an outside thereof and are spaced apart from one another; a second sheet having a plurality of first holes spaced apart from one another by a predetermined distance and filled with the ESD protection material; a third sheet having second and third internal electrodes respectively formed on top and bottom surfaces to pass through portions corresponding to the plurality of first holes; a fourth sheet having a plurality of second holes formed at positions corresponding to the plurality of first holes and filled with the ESD protection material; and a fifth sheet having a plurality of fourth internal electrodes formed extending from positions corresponding to the plurality of first and second holes to be exposed to an outside thereof.

The upper and lower cover layers, the common mode noise filter and the ESD protection device may be formed of nonmagnetic sheets.

The ESD protection material may include a mixture in which an organic material is mixed with one conductive material selected from $RuO_2$, Pt, Pd, Ag, Au, Ni, Cr, W and combinations thereof.

The ESD protection material may be prepared by further mixing a varistor material or an insulating ceramic material with the mixture.

According to another aspect of the present invention, there is provided a circuit protection device including a common mode noise filter including a coil pattern surrounding a magnetic material and an internal electrode connected to the coil patterns; and an ESD protection device laminated to and jointed with the common mode noise filter, the ESD protection device including an ESD protection material filled in a hole and an internal electrode connected to the ESD protection material.

The common mode noise filter and the ESD protection device may be formed by laminating sheets of the same material.

The magnetic material may be filled in the holes passing through the sheets.

The ESD protection device may have a capacitance of 1 pF or less.

According to a further aspect of the present invention, there is provided a method of manufacturing a circuit protection device, which includes: preparing a plurality of nonmagnetic sheets; optionally forming holes in the plurality of nonmagnetic sheets; optionally filling the holes of the plurality of nonmagnetic sheets with a magnetic material, a conductive material or an ESD protection material; optionally forming internal electrodes or coil patterns on the plurality of nonmagnetic sheets; laminating and compressing the nonmagnetic sheets and then cutting the laminate; and sintering the laminate and then forming external electrodes to be connected to the internal electrode.

Advantageous Effects

As described above, according to the present invention, a circuit protection device is formed as a single device by laminating a solenoid-type common mode noise filter and an ESD protection device, and the circuit protection device is disposed between a circuit and input/output terminals of an electronic device, so that common mode noises and ESD of the electronic device can be simultaneously prevented using a single chip device.

As described above, according to the present invention, there is provided a circuit protection device implemented as a single composite device formed by laminating and compressing a common mode noise filter, which has a screw-thread-shaped coil surrounding a magnetic core formed by laminating magnetic layers formed on a plurality of sheets, and an ESD protection device which has an ESD protection material embedded in a plurality of sheets, and a method of manufacturing the circuit protection device; or by laminating and compressing a common mode noise filter and an ESD protection device filled with ESD protection material, wherein a coil unit is manufactured by laminating a plurality of sheets and by winding internal electrodes around magnetic layers filled in holes, and the coil unit is inserted into a coil unit insertion space of a coil insertion unit formed by laminating a plurality of sheets.

The circuit protection device implemented as described above is disposed between a circuit and input/output terminals of an electronic device, so that common mode noises and ESD of the electronic device can be simultaneously prevented using a single chip device. Accordingly, the circuit protection device is manufactured in the form of a single chip to have a compact configuration as compared with a conventional art in which discrete devices are used to prevent common mode noises and ESD, so that an increase in size of an electronic device can be prevented, a mounting area can be remarkably reduced, and input/output signal distortion can be prevented by implementing a low-capacity ESD protection device to thereby enhance the reliability of the electronic device.

BEST MODE

Hereinafter, exemplary embodiments of the present invention will be described in detail with reference to the accompanying drawings.

Figure 1:
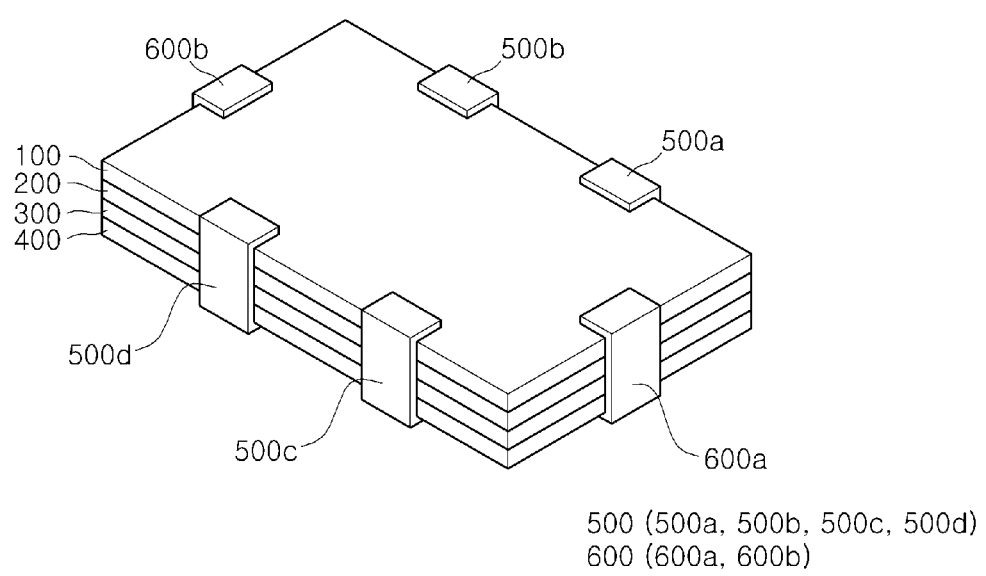
FIG. 1 is a perspective view showing an assembled state of a circuit protection device according to a first exemplary embodiment of the present invention.
Figure 2:
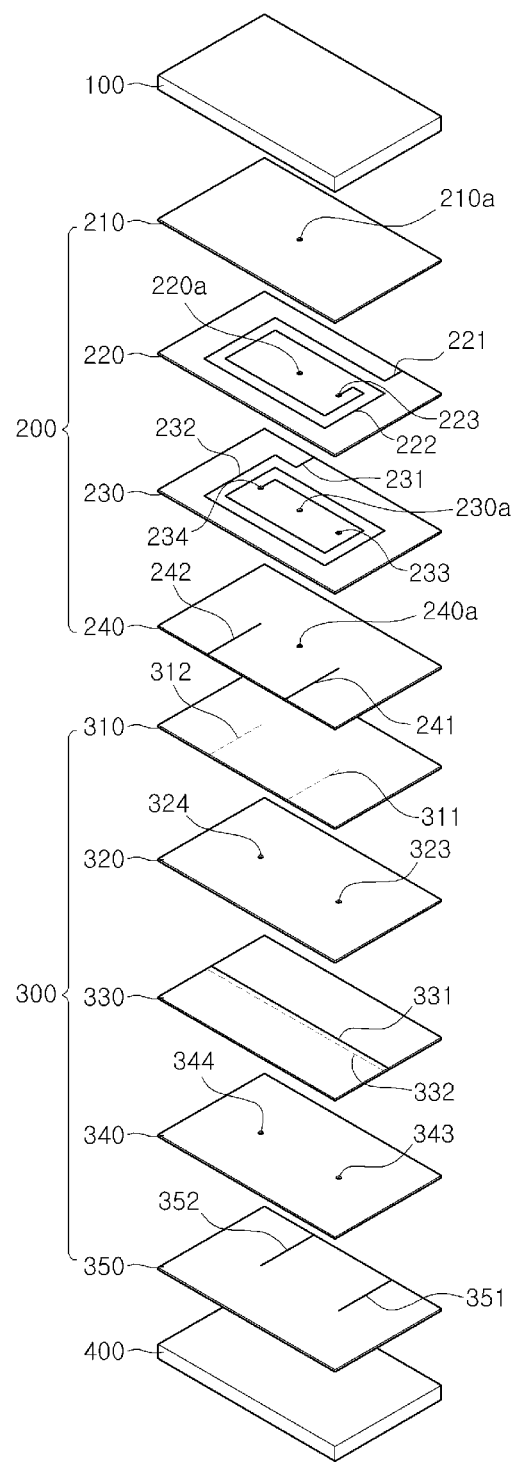
FIG. 2 is an exploded perspective view of the circuit protection device according to the first exemplary embodiment of the present invention.

FIG. 1 is a perspective view showing an assembled state of a circuit protection device according to a first exemplary embodiment of the present invention, and FIG. 2 is an exploded perspective view of the circuit protection device.

Referring to FIGS. 1 and 2, the circuit protection device according to the first exemplary embodiment of the present invention is formed by laminating a plurality of insulating sheets including an upper cover layer 100, a common mode noise filter 200, an ESD protection device 300 and a lower cover layer 400 from the top. The circuit protection device further includes: external electrodes 500 (500*a*, 500*b*, 500*c* and 500*d*) connected to some of internal electrodes of the common mode noise filter 200 and some of internal electrodes of the ESD protection device 300; and external electrodes 600 (600*a* and 600*b*) connected to some of internal electrodes of the ESD protection device 300. Meanwhile, each of the upper and lower cover layers 100 and 400 may be formed by laminating a plurality of sheets. And a plurality of the sheets of the upper and lower layers 100 and 400, the common mode noise filter 200 and the ESD protection device 300 are formed of nonmagnetic sheets.

The common mode noise filter 200 is configured by laminating sheets 210, 220, 230 and 240 that are optionally formed with internal electrode, a coil pattern, a hole filled with a magnetic material, and a hole filled with a conductive material.

A hole 210*a* is formed at a predetermined region, preferably a central region, of the sheet 210. The hole 210*a* is filled with a magnetic paste. The magnetic paste includes ferrite, Ni-based, Ni—Zn-based, and Ni—Zn—Cu-based materials, and the like.

The sheet 220 is formed with an internal electrode 221, a coil pattern 222, a hole 220*a* and a hole 223. The hole 220*a* is formed at a central region of the sheet 220 corresponding to the hole 210*a* of the sheet 210 and filled with a magnetic paste such as a ferrite, Ni-based, Ni—Zn-based, or Ni—Zn—Cu-based material. The hole 223 is spaced apart from the hole 220*a* toward a side of the sheet 220 by a predetermined distance and filled with a conductive paste. The internal electrode 221 is formed by extending from the coil pattern 222 to be exposed at a predetermined region of one long side of the sheet 220. The coil pattern 222 is formed in a spiral shape from the internal electrode 221 toward the hole 223.

The sheet 230 is formed with an internal electrode 231, a coil pattern 232 and a plurality of holes 230*a*, 233 and 234. The hole 230*a* is formed at a central region of the sheet 230 corresponding to the holes 210*a* and 220*a* respectively formed on the sheets 210 and 220. The hole 230*a* is filled with a magnetic paste such as a ferrite, Ni-based, Ni—Zn-based or Ni—Zn—Cu-based material. The hole 233 is formed at a predetermined region of the sheet 230 corresponding to the hole 223 of the sheet 220, and filled with a conductive paste. The hole 234 is formed at a position opposite to the hole 233 with respect to the hole 230*a*, and filled with a conductive paste. The internal electrode 231 is formed by extending from the coil pattern 232 to be partially exposed at a predetermined region of one long side of the sheet 230 and is spaced apart from the internal electrode 221 formed on the sheet 220 by a predetermined distance. The coil pattern 232 is formed in a spiral shape from the internal electrode 231 toward the hole 234.

The sheet 240 is formed with a plurality of internal electrodes 241 and 242, and a hole 240*a*. The hole 240*a* is formed at a central region of the sheet 230 corresponding to the holes 210*a*, 220*a* and 230*a* that are respectively formed on the sheets 210, 220 and 230. The hole 240*a* is filled with a magnetic paste such as a ferrite, Ni-based, Ni—Zn-based or Ni—Zn—Cu-based material. The plurality of internal electrodes 241 and 242 are formed to extend to the other long side of the sheet 240 opposite to the one long side where the internal electrodes 221 and 231 respectively formed on the sheets 220 and 230 are exposed. The internal electrode 241 is formed in a shape of a straight line extending from a predetermined region of the sheet 240 corresponding to the holes 223 and 233 to be exposed at the other long side of the sheet 240. The internal electrode 242 is formed in a shape of a straight line extending from a predetermined region of the sheet 240 corresponding to the hole 234 to be exposed at the other long side of the sheet 240.

Meanwhile, each of the sheets 210, 220, 230 and 240 is formed of a nonmagnetic sheet. The internal electrodes 221, 231, 241 and 242 and the coil patterns 222 and 232 are respectively formed of a conductive paste by a screen printing method. In addition, a sputtering method, an evaporation method, a sol-gel coating method or the like may be employed. Each of the holes 210*a*, 220*a*, 230*a* and 240*a* is filled with a magnetic paste, and each of the holes 223, 233 and 234 is filled with a conductive paste. Thus, the coil pattern 222 and the internal electrode 241 are connected through the holes 223 and 233, and the coil pattern 232 and the internal electrode 242 are connected through the hole 234. Accordingly, a solenoid-type common mode noise filter, in which the coil of the conductive pattern surrounds the magnetic core of the magnetic paste filled in the holes 210*a*, 220*a*, 230*a* and 240*a*, is formed.

The ESD protection device 300 is configured by laminating a plurality sheets 310, 320, 330, 340 and 350, each of which is optionally formed with internal electrodes and holes.

A plurality of internal electrodes 311 and 312 are formed on a bottom surface of the sheet 310. The plurality of internal electrodes 311 and 312 are formed in a shape of a straight line extending from a central portion of the bottom surface of the sheet 310 to be exposed at one long side of the sheet and are spaced apart from each other.

The sheet 320 is formed with a plurality of holes 323 and 324. The plurality of holes 323 and 324 are respectively formed at positions corresponding to the plurality of internal electrodes 311 and 312 that are formed extending from the central portion of the sheet 310. That is, the plurality of holes 323 and 324 are formed at the central portion of the sheet 320 to be spaced apart from each other. Further, each of the plurality of holes 323 and 324 is filled with an ESD protection material.

Internal electrodes 331 and 332 are formed on top and bottom surfaces of the sheet 330, respectively. The internal electrodes 331 and 332 are formed at positions corresponding to each other on the top and bottom surfaces of the sheet 330 to have a shape of a straight line to be exposed at central portions of one and the other short sides of the sheet 330 passing through positions corresponding the holes 323 and 324 of the sheet 320 are formed.

The sheet 340a is formed with a plurality of holes 343 and 344 which are respectively formed at positions corresponding to the plurality of holes 323 and 324 formed on the sheet 320. Further, each of the plurality of holes 343 and 344 is filled with an ESD protection material.

A plurality of internal electrodes 351 and 352 are formed on the sheet 350. The plurality of internal electrodes 351 and 352 are formed to extend to the other long side of the sheet 350 opposite to the one long side of the sheet 310 where the internal electrodes 311 and 312 are exposed. The internal electrode 351 is formed in a shape of a straight line extending from a predetermined region of the sheet 350 corresponding to the holes 323 and 343 to be exposed at the other long side of the sheet 350. In addition, the internal electrode 352 is formed in a shape of a straight line extending from a predetermined region of the sheet 350 corresponding to the holes 324 and 344 to be exposed at the other long side of the sheet 350. The internal electrodes 351 and 352 are spaced apart from each other at a predetermined distance.

Meanwhile, each of the internal electrodes 311, 312, 331, 332, 351 and 352 is formed of a conductive paste by a screen printing method. In addition, a sputtering method, an evaporation method, a sol-gel coating method or the like may be employed. Each of the holes 323, 324, 343 and 344 is filled with an ESD protection material. Here, the ESD protection material may include a mixture in which an organic material such as polyvinyl alcohol (PVA) or polyvinyl butyral (PVB) is mixed with a conductive material selected from $RuO_2$, Pt, Pd, Ag, Au, Ni, Cr, W and combinations thereof. Further, the ESD protection material may be obtained by further mixing a varistor material such as ZnO or an insulating ceramic material such as $Al_2O_3$ with the mixture.

The ESD protection material described above exists in a state where conductive and insulating materials are mixed at a predetermined ratio. That is, conductive particles are distributed in the insulating material. Thus, an insulating state is maintained if a voltage lower than a predetermined value is applied to the internal electrodes, while discharge is generated between the conductive particles to reduce a voltage difference between corresponding internal electrodes if a voltage higher than a predetermined value is applied to the internal electrodes.

Meanwhile, the internal electrode 221 of the common mode noise filter 200 and the internal electrode 351 of the ESD protection device 300 are connected to the external electrode 500a, and the internal electrode 231 of the common mode noise filter 200 and the internal electrode 352 of the ESD protection device 300 are connected to the external electrode 500b. The internal electrode 241 of the common mode noise filter 200 and the internal electrode 311 of the ESD protection device 300 are connected to the external electrode 500c, and the internal electrode 232 of the common mode noise filter 200 and the internal electrode 312 of the ESD protection device 300 are connected to the external electrode 500d. In addition, one and the other sides of each of the internal electrodes 331 and 332 are connected to the external electrodes 600a and 600b, respectively.

Figure 3:
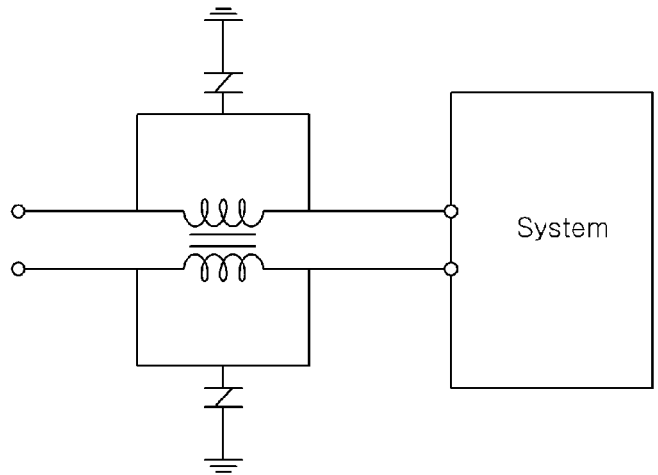
FIG. 3 is an equivalent circuit diagram of the circuit protection device according to the first exemplary embodiment of the present invention.

As described above, in the circuit protection device according to the first exemplary embodiment of the present invention, which is a composite device of the ESD protection device and the solenoid-type common mode noise filter that has the coil of the conductive pattern surrounding the magnetic core formed with the magnetic paste filled in the holes vertically formed through the plurality of laminated sheets, the external electrodes 500 are connected between a system and 1-channel input/output terminal used in an electronic device, and the external electrodes 600 are connected to ground terminals, so that it is possible to remove common mode noises and flow static electricity introduced into the input/output terminals into the ground terminals as shown in the equivalent circuit diagram of FIG. 3. That is, the laminated common mode noise filter having the coil surrounding the magnetic core is disposed between a power source and a system to effectively prevent common mode noises. Also, the ESD protection device is connected to the ground terminals between the input/output terminals and the system. Therefore if an undesired voltage higher than a predetermined value is applied to both ends of the circuit protection device, discharge is generated between the conductive particles in the ESD protection material to flow a current into the ground terminals, so that a voltage difference between both ends of the corresponding circuit protection device is reduced. At this state, since both ends of the circuit protection device are not electrically conductive to each other, input signals are transmitted to the input/output terminals without distortion. That is, even when static electricity is generated, it is discharged to the ground terminals through the corresponding protection circuit device, so that the circuit is protected and signals received and transmitted by the system is maintained as they are.

In the circuit protection device configured as described above, since the width of the through holes of the ESD protection device filled with an ESD protection material is as narrow as several μm to several hundreds of μm, capacitance of the ESD protection device can be adjusted, for example, to be 10 pF or less, preferably 1 pF or less. Thus, in the circuit protection device, capacitance at the input/output terminals using a high frequency is not changed, and signal distortion caused by the change of the capacitance is not generated.

Figure 4:
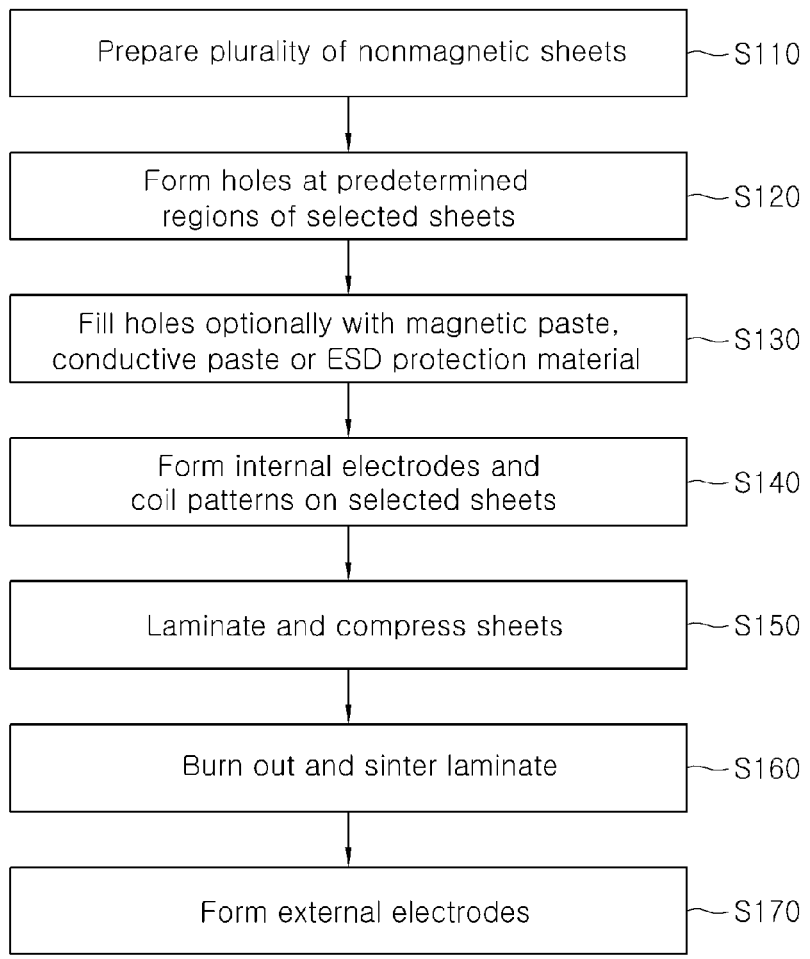
FIG. 4 is a flowchart illustrating a method of manufacturing the circuit protection device according to the first exemplary embodiment of the present invention.

Hereinafter, a method of manufacturing the aforementioned circuit protection device formed by laminating a common mode noise filter and an ESD protection device according to the first exemplary embodiment of the present invention will be described with reference to FIG. 4.

S110: A plurality of rectangular sheets in which a nonmagnetic material is mixed are prepared. For this, raw material is prepared by mixing a material having a thermal expansion coefficient similar to that of ferrite, among $B_2O_3$—$SiO_2$-based glass, $Al_2O_3$—$SiO_2$-based glass and other ceramic materials, with a composition including $Al_2O_3$, glass frit and the like, and ball milling the mixture with a solvent such as alcohol for 24 hours. Then, slurry is prepared by measuring an organic binder as an additive of about 6 wt % with respect to the raw material; dissolving the organic binder in a toluene/alcohol-based solvent to be input into the raw material; and milling and mixing the raw material into which the additive is input using a small ball mill for about 24 hours. Thereafter, a sheet having a desired thickness is manufactured using the slurry by a doctor blade method or the like.

S120: A hole is formed in a predetermined region of a selected sheet. That is, a plurality of holes is formed in a predetermined region of each sheet 210, 220, 230 or 240 to be used for the common mode noise filter 200. More specifically, the holes 210a and 240a are respectively formed at the central portions of the sheets 210 and 240; the holes 220a and 223 are respectively formed at a central portion of the sheet 220 and at a position spaced apart from the central portion to one side of the sheet 220; and the holes 230a, 233 and 234 are respectively formed at the central portion of sheet 230 and at positions spaced apart from the central portion to one and the other sides of the sheet 230. The holes 323, 324, 343 and 344 are formed on the sheets 320 and 340 of the ESD protection device 300. These holes are formed to have a size of several μm to several hundreds of μm using a laser punching or a mechanical punching methods or the like.

S130: The holes 210a, 220a, 230a and 240a respectively formed at the central portions of the sheets 210, 220, 230 and 240 to be used for the common mode noise filter 200 are filled with a magnetic paste, and the holes 223, 233 and 234 formed on the sheets 220 and 230 are filled with a conductive paste such as Pd, Ag/Pd or Ag. In addition, the holes 323, 324, 343 and 344 formed on the sheets 330 and 340 to be used for the ESD protection device are filled with an ESD protection material. The ESD protection material may be formed of a material in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Meanwhile, the ESD protection material may be obtained by further mixing a varistor material such as ZnO or an insulating ceramic material such as $Al_2O_3$ with the mixture.

S140: Desired internal electrodes and coil patterns are formed on the selected sheets to implement the common mode noise filter 200, and internal electrodes are formed on the selected sheets to implement the ESD protection device 300. That is, a conductive paste such as Pd, Ag/Pd or Ag is printed on the plurality of sheets having holes filled with the conductive paste or the ESD protection material, for example, by a screen printing method, thereby forming the internal electrodes and the coil patterns for implementing the common mode noise filter 200 and the internal electrodes for implementing the ESD protection device 300.

S150: A rectangular hexahedral laminate is manufactured by laminating a plurality of sheets used for the upper cover layer 100, the sheets 210, 220, 230, and 240 having the predetermined internal electrodes, coil patterns and holes, the sheets 310, 320, 330, 340 and 350, and the sheets used for the lower cover layer 400; compressing the laminated sheets at a pressure of 200 to 700 kgf/cm$^2$; and then cutting the laminate at a desired unit chip size. Dummy sheets may be further inserted between the upper cover layer 100 and the sheet 210, and between the sheet 350 and the lower cover layer 400.

S160: Continuously, the sheet laminate is burnt-out in a furnace at a temperature of 230 to 350° C. for 20 to 40 hours to remove binder components, and then sintered at a temperature of 700 to 900° C. for 20 to 40 hours. Here, since in the circuit protection device according to the present invention, the sheets used for the common mode noise filter and the sheets used for the ESD protection device are the same, the sheets can be simultaneously sintered, and thus, a manufacturing process of the circuit protection device can be simplified.

S170: The external electrodes 500 and 600 are formed on the outer surface of the sheet laminate sintered in the furnace and then sintered at a temperature of 600 to 800° C. for 30 minutes to 2 hours, and thereby the circuit protection device according to the first exemplary embodiment of the present invention is completed. Here, the external electrodes 500 are connected to internal electrodes 221, 231, 241 and 242 of the common mode noise filter 200 and the internal electrodes 311, 312, 351 and 352 of the ESD protection device 300. Also, the external electrodes 600 are connected to the internal electrodes 331 and 332 of the ESD protection device 300.

Figure 5:
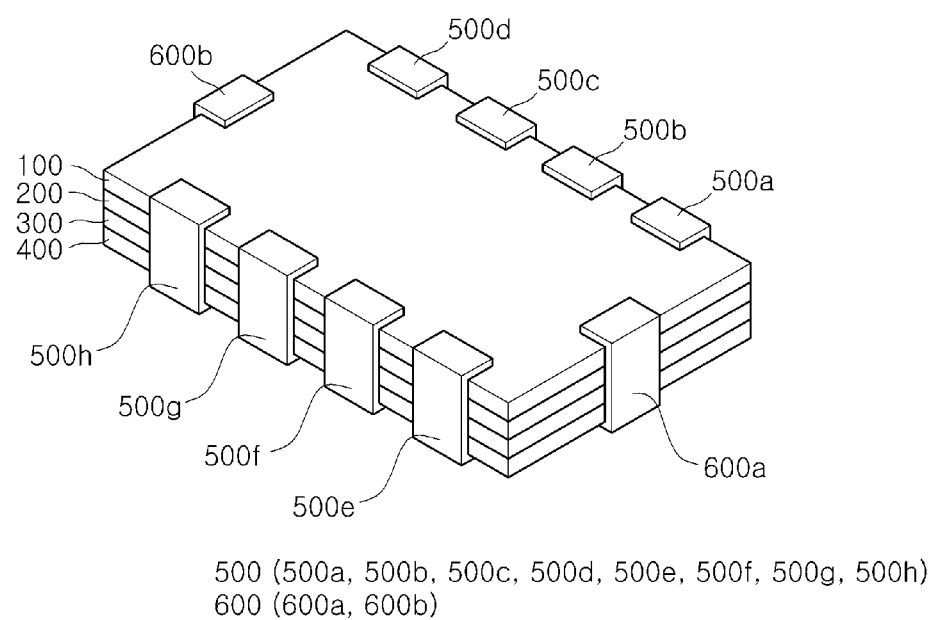
FIG. 5 is a perspective view showing an assembled state of a circuit protection device according to a second exemplary embodiment of the present invention.
Figure 6:
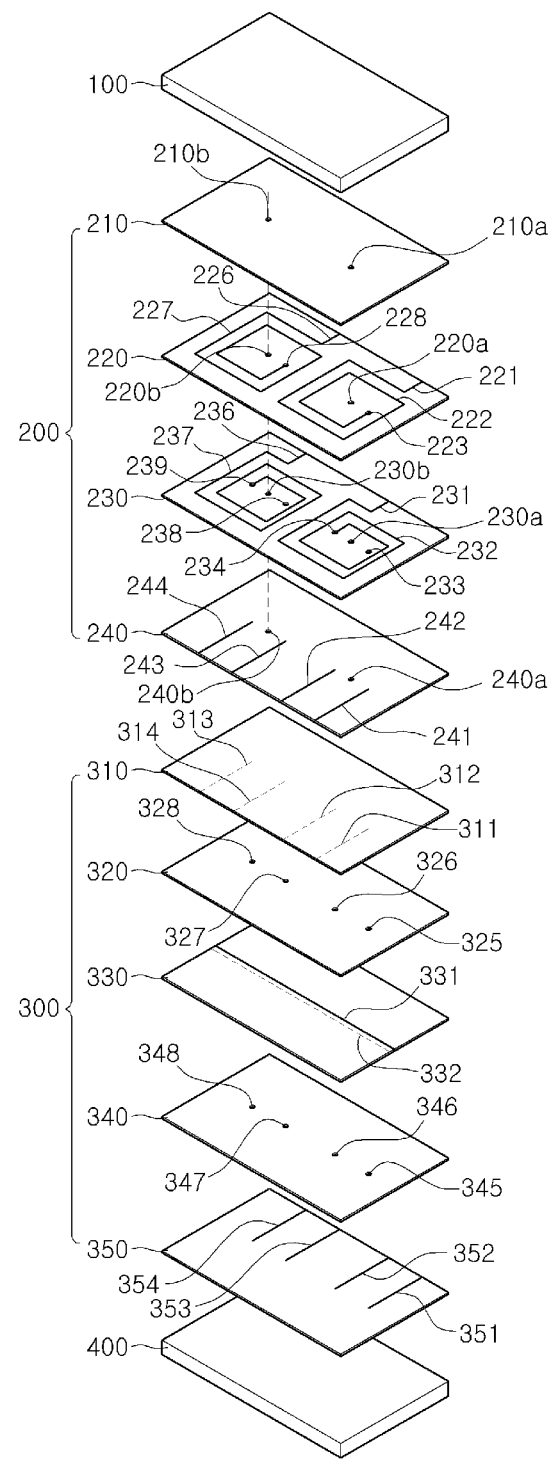
FIG. 6 is an exploded perspective view of the circuit protection device according to the second exemplary embodiment of the present invention.

FIG. 5 is a perspective view showing an assembled state of a circuit protection device according to a second exemplary embodiment of the present invention, and FIG. 6 is an exploded perspective view of the circuit protection device. As compared with the circuit protection device according to the first exemplary embodiment of the present invention that is connected between a system and 1-channel input/output terminals, the circuit protection device according to the second exemplary embodiment of the present invention is connected between a system and 2-channel input/output terminals, and is different in that two internal electrodes, two coil patterns, two holes filled with a magnetic paste and two holes filled with a conductive paste are formed on one sheet of a common mode noise filter 200, and eight external electrodes 500 are formed.

The common mode noise filter 200 is configured by laminating a plurality of sheets 210, 220, 230 and 240, each of which is optionally formed with internal electrodes, coil patterns, holes filled with a magnetic material, and holes filled with a conductive material.

Holes 210a and 210b are formed to be spaced apart from each other in a predetermined region, preferably a central region, of the sheet 210. The holes 210a and 210b are filled with a magnetic paste. The magnetic paste includes ferrite, Ni-based, Ni—Zn-based, and Ni—Zn—Cu-based materials, and the like.

The sheet 220 is formed with a plurality of internal electrodes 221 and 226, a plurality of coil patterns 222 and 227, and a plurality of holes 220a, 220b, 223 and 228. The holes 220a and 220b are formed in a central region on the sheet 220 at positions corresponding to the holes 210a and 210b formed on the sheet 210 and filled with a magnetic paste. The holes 223 and 228 are respectively spaced apart from the holes 220a and 220b by a predetermined distance and filled with a conductive paste. The internal electrodes 221 and 226 are respectively formed so that they extend from the coil patterns 222 and 227 to be exposed at predetermined regions of one long side of the sheet 220 and are spaced apart from each other at a predetermined distance. The coil patterns 222 and 227 are respectively formed in a spiral shape from the internal electrodes 221 and 226 to the holes 223 and 228, and the coil patterns are spaced apart not to overlap with each other.

The sheet 230 are formed with a plurality of internal electrodes 231 and 236, a plurality of coil patterns 232 and 237, and a plurality of holes 230a, 230b, 233, 234, 238 and 239. The holes 230a and 230b are formed in a central region on the sheet 230 at positions corresponding to the holes 210a and 210b and the holes 220a and 220b respectively formed on the sheets 210 and 220, and filled with a magnetic paste. The holes 233 and 234 are spaced apart from the hole 230a by a predetermined distance, formed to be symmetric with respect to the hole 230a, and filled with a conductive paste. The holes 238 and 239 are spaced apart from the hole 230b by a predetermined distance, formed to be symmetric with respect to the hole 230b, and filled with a conductive paste. It will be apparent that the holes 230a, 230b, 233, 234, 238 and 239 are spaced apart from one another at a predetermined distance. The internal electrodes 231 and 236 are formed so that they respectively extend from the coil patterns 232 and 237 to be exposed at predetermined regions of one long side of the sheet 230 and are spaced apart from each other at a predetermined distance. The coil patterns 232 and 237 are respectively formed in a spiral shape from the internal electrodes 231 and 236 to the holes 234 and 239, and the coil patterns are spaced apart not to overlap with each other.

The sheet 240 is formed with a plurality of internal electrodes 241, 242, 243 and 244, and a plurality of holes 240a and 240b. The holes 240a and 240b are respectively formed in a central region of the sheet 240 at positions corresponding to the holes 210a and 210b, the holes 220a and 220b and the holes 230a and 230b respectively formed on the sheets 210, 220 and 230, and filled with a magnetic material such as a ferrite, Ni-based, Ni—Zn-based, or Ni—Zn—Cu-based material. The plurality of internal electrodes 241, 242, 243 and 244 are formed extending to the other long side of the sheet 240 opposite to the one long side where the internal electrodes 221 and 226 and the internal electrodes 231 and 236 respectively formed on the sheets 220 and 230 are exposed. The internal electrode 241 is formed in a shape of a straight line extending from a predetermined region of the sheet 240 corresponding to the holes 223 and 233 to be exposed at the other long side of the sheet 240. The internal electrode 242 is also formed extending from a predetermined region of the sheet 240 corresponding to the hole 234 to be exposed at the other long side of the sheet 240. The internal electrode 243 is formed in a shape of a straight line extending from a predetermined region of the sheet 240 corresponding to the holes 228 and 238 to be exposed at the other long side of the sheet 240. The internal electrode 244 is also formed extending from a predetermined region of the sheet 240 corresponding to the hole 239 to be exposed at the other long side of the sheet 240.

Meanwhile, the plurality of internal electrodes 221, 226, 231, 236, 241, 242, 243 and 244 and a plurality of coil patterns 222, 227, 232 and 237 are respectively formed of a conductive paste by a sputtering method, a screen printing method, an evaporation method, a sol-gel coating method or the like. The holes 210a, 210b, 220a, 22b, 230a, 230b, 240a and 240b are respectively filled with a magnetic paste, and the holes 223, 228, 233, 234, 238 and 239 are respectively filled with a conductive paste. Thus, the coil pattern 222 is connected to the internal electrode 241 through the holes 223 and 233, and the coil pattern 232 is connected to the internal electrode 242 through the hole 234. In addition, the coil pattern 227 is connected to the internal electrode 243 through the holes 228 and 238, and the coil pattern 237 is connected to the internal electrode 244 through the hole 239. Thus, a dual solenoid-type common mode noise filter, in which two coils respectively surround the two magnetic cores, is formed.

The ESD protection device 300 is configured by laminating a plurality sheets 310, 320, 330, 340 and 350, each of which is optionally formed with internal electrodes and holes.

A plurality of internal electrodes 311, 312, 313 and 314 are formed on a bottom surface of the sheet 310. The plurality of internal electrodes 311, 312, 313 and 314 are formed in a shape of a straight line extending from a central portion of the bottom surface of the sheet 310 to be exposed at one long side of the sheet 310 and are spaced apart from one another.

The sheet 320a is formed with a plurality of holes 325, 326, 327 and 328, which are respectively formed at positions corresponding to the plurality of internal electrodes 311, 312, 313 and 314 that are formed by extending from the central portion of the sheet 310. That is, the plurality of holes 325, 326, 327 and 328 are formed at the central portion of the sheet 320 to be spaced apart from one another. Further, each of the plurality of holes 325, 326, 327 and 328 is filled with an ESD protection material.

Internal electrodes 331 and 332 are formed on top and bottom surfaces of the sheet 330, respectively. The internal electrodes 331 and 332 are formed at positions corresponding to each other on the top and bottom surfaces of the sheet 330 to have a shape of a straight line to be exposed at central portions of one short side and the other long side of the sheet 330 while passing through positions of the sheet 330 respectively corresponding to the positions at which the holes 325, 326, 327 and 328 of the sheet 320 are formed.

The sheet 340 is formed with a plurality of holes 345, 346, 347 and 348 which are respectively formed at positions corresponding to the plurality holes 325, 326, 327 and 328 formed on the sheet 320. Further, each of the plurality of holes 345, 346, 347 and 348 is filled with an ESD protection material.

A plurality of internal electrodes 351, 352, 353 and 354 are formed on the sheet 350. The plurality of internal electrodes 351, 352, 353 and 354 are formed to extend to the other long side of the sheet 350 opposite to the one long side of the sheet 310 where the plurality of internal electrodes 311, 312, 313 and 314 are exposed.

Meanwhile, each of the plurality of holes 325, 326, 327, 328, 345, 346, 347 and 348 is filled with an ESD protection material. Here, the ESD protection material may include a mixture in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Further, the ESD protection material may be obtained by further mixing a varistor material such as ZnO or an insulating ceramic material such as $Al_2O_3$ with the mixture.

The upper and lower cover layers 100 and 400, the plurality of sheets 210, 220, 230 and 240 of the common mode noise filter 200, and the plurality of sheets 310, 320, 330, 340 and 350 of the ESD protection device 300 are formed of a nonmagnetic sheet.

According to this exemplary embodiment, two composite devices are implemented in a single chip. However, the present invention is not limited thereto, but the number of composite devices may be three or more.

Figure 7:
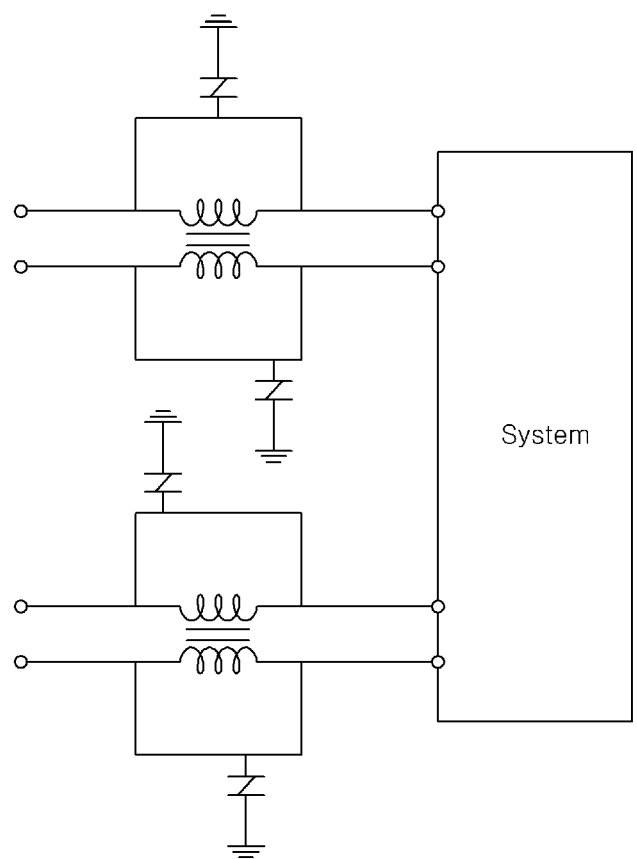
FIG. 7 is an equivalent circuit diagram of the circuit protection device according to the second exemplary embodiment of the present invention.

As described above, in the circuit protection device according to the second exemplary embodiment of the present invention, which is a composite device of the ESD protection device and the common mode noise filter that has the coil of the conductive pattern surrounding the magnetic core of the magnetic paste filled in the holes vertically formed through the plurality of laminated sheets, the external electrodes 500 are connected between a system and 2-channel input/output terminals used in an electronic device, and the external electrodes 600 are connected to ground terminals, so that it is possible to remove common mode noises and flow static electricity introduced into the input/output terminals into the ground terminals as shown in the equivalent circuit diagram of FIG. 7. At this state, since both ends of the circuit protection device are not electrically conductive to each other, input signals are transmitted to the input/output terminals without distortion. That is, even when static electricity is generated, it is discharged to the ground terminals through the corresponding protection circuit device, so that the circuit is protected and signals received and transmitted by the system is maintained as they are.

In the circuit protection device configured as described above, since the width of the through holes of the ESD protection device filled with an ESD protection material is as narrow as several μm to several hundreds of μm, capacitance of the ESD protection device can be adjusted, for example, to 10 pF or less, preferably 1 pF or less. Thus, in the circuit protection device, capacitance at the input/output terminals using a high frequency is not changed, and signal distortion caused by the change of the capacitance is not generated.

In addition, common mode noises and ESD inputted through many channels can be prevented using one circuit protection device although the number of channels is increased, so that the number of circuit protection devices can be decreased, and thus, the size of electronic devices can be reduced.

According to the first and second exemplary embodiments of the present invention, the circuit protection device is formed as a composite of an ESD protection device and a common mode noise filter in which a coil is wound around a magnetic core, wherein the magnetic core is formed of magnetic paste filled in a hole which is vertically formed on a plurality of sheets laminated with each other, and the coil is formed of conductive pattern. However, the circuit protection device is not limited thereto, and can be changed or modified in various forms. Circuit protection devices according to another exemplary embodiments will be described as follows.

Figure 8:
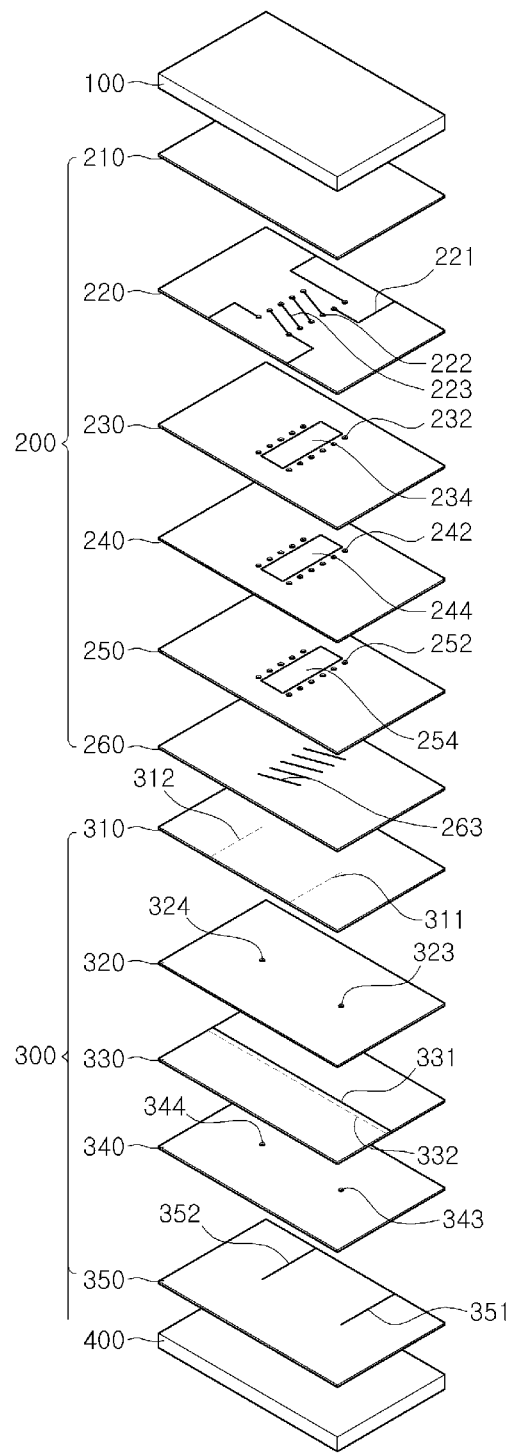
FIG. 8 is an exploded perspective view of the circuit protection device according to a third exemplary embodiment of the present invention.
Figure 9:
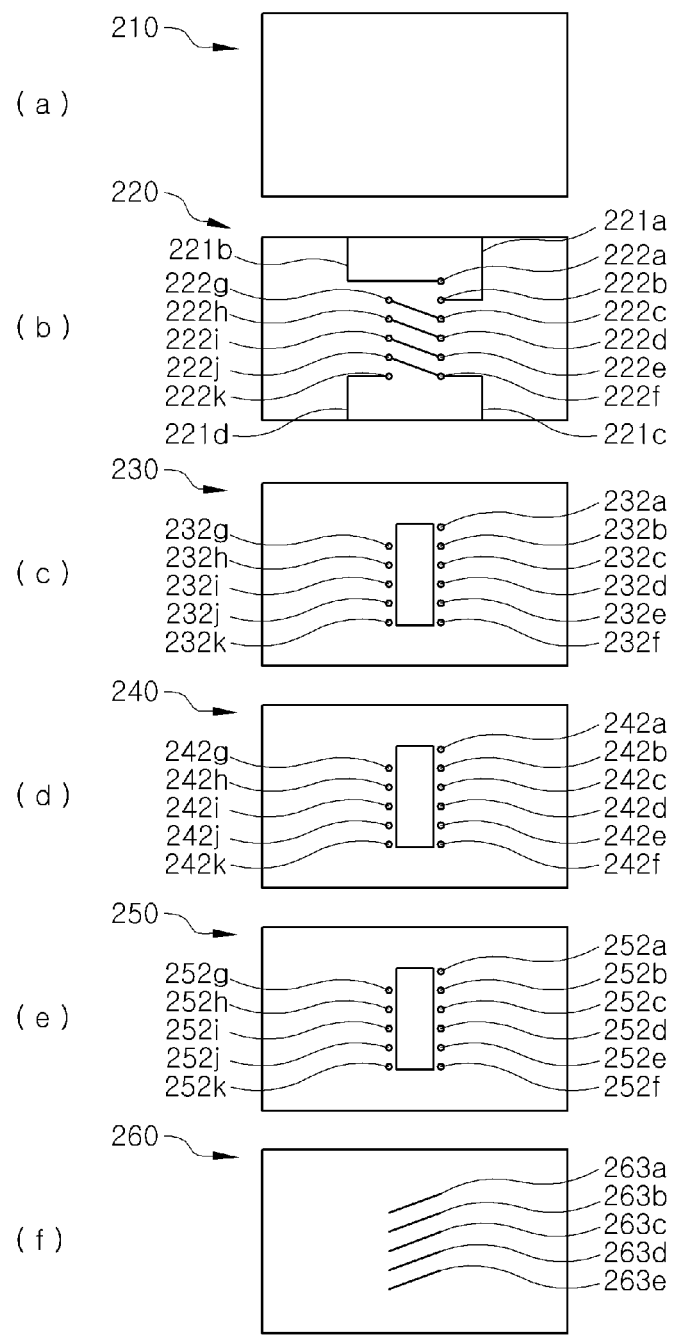
FIGS. 9 (*a*) to 9 (*f*) are plan views of respective sheets of a common mode noise filter of the circuit protection device according to the third exemplary embodiment of the present invention.

FIG. 8 is an exploded perspective view of the circuit protection device according to a third exemplary embodiment of the present invention, and FIGS. 9 (a) to 9 (f) are plan views of respective sheets of a common mode noise filter of the circuit protection device. According to the third exemplary embodiment of the present invention, the circuit protection device is formed as a composite of an ESD protection device and a common mode noise filter in which a screw-thread-shaped coil is formed around a magnetic core to an upper and lower portion, wherein the magnetic core is configured by laminating magnetic layers formed in a plurality of sheets. Further, a perspective view showing an assembled state of the circuit protection device according to the third exemplary embodiment of the present invention is identical to FIG. 1, and will be described referring to FIG. 1.

Referring to FIGS. 1 and 8, the circuit protection device according to the first exemplary embodiment of the present invention is formed by laminating a plurality of insulating sheets and includes an upper cover layer 100, a common mode noise filter 200, an ESD protection device 300 and a lower cover layer 400. The circuit protection device may further include external electrodes 500 (500a, 500b, 500c and 500d) connected to some of internal electrodes of the common mode noise filter 200 and some of internal electrodes of the ESD protection device 300, and external electrodes 600 (600a and 600b) connected to some of internal electrodes of the ESD protection device 300. In addition, the plurality of sheets of the upper cover layer 100, the common mode noise filter 200, the ESD protection device 300 and the lower cover layer 400 may be formed of a nonmagnetic sheet. Meanwhile, a plurality of sheets of the upper and lower cover layers 100 and 400 may be formed of a magnetic sheet.

The common mode noise filter 200 is configured by laminating sheets 210, 220, 230, 240, 250 and 260, each of which is optionally formed with internal electrodes of a conductive material, a magnetic layer of a magnetic material with which an opening is filled, and holes filled with a conductive material. Referring to FIGS. 8 and 9, the details thereon will be described as follows.

The sheet 210 is formed of a nonmagnetic sheet to function as a cover sheet for covering a top of the sheet 220 and protecting the internal electrodes and holes thereon.

The sheet 220 is formed of a nonmagnetic sheet, and has a plurality of internal electrodes 221 (221a to 221d) extending to the outside, a plurality of holes 222 (222a to 222k), and a plurality of internal electrodes 223 (223a to 223d) selectively connecting the plurality of holes. The plurality of holes 222a to 222k are formed in two lines on a central region of the sheet 220 to be spaced apart so that they face each other. For example, six holes 222a to 222f in a first line and five holes 222g to 222k in a second line are formed to face each other. More specifically, the holes 222b to 222f except the hole 222a in the first line and the holes 222g and 222k in the second line are formed to face each other. The holes 222a to 222f in the first line and the holes 222g to 222k in the second line may be formed at the same intervals, or may be formed at irregular intervals not to be in contact with each other. Of course, although the plurality of holes 222a to 222k are symmetrically formed to face each other, the present invention is not limited thereto. That is, the plurality of holes 222a to 222k may be formed in a zigzag pattern. The plurality of internal electrodes 221a to 221d are formed so that the two internal electrodes 221a and 221b are exposed at one long side of the sheet 220 and the two internal electrodes 221c and 221d are exposed at the other long side of the sheet 220. That is, the internal electrode 221a is formed extending from the hole 222b to be exposed at the one long side of the sheet 220, and the internal electrode 221b is formed extending from the hole 222a to be exposed at the one long side of the sheet 220 and is spaced apart from the internal electrode 221a by a predetermined distance. The internal electrode 221c is formed extending from the hole 222f to be exposed at the other long side of the sheet 220 and faces the internal electrode 221a, and the internal electrode 221d is formed extending from the hole 222k to be exposed at the other side of the sheet 220 and faces the internal electrode 221b. The plurality of internal electrodes 223a to 223d connect the holes 222c to 222f in the first line and the holes 222g to 222j in the second line, respectively. That is, the internal electrode 223a connects the holes 222c and 222g, the internal electrode 223b connects the holes 222d and 222h, the internal electrode 223c connects the holes 222e and 222i, and the internal electrode 223d connects the holes 222f and 222j. Meanwhile, the plurality of internal electrodes 221a to 221d and the plurality of internal electrodes 223a to 223d are formed of a conductive paste, and the plurality of holes 222a and 222k are filled with a conductive paste.

The sheet 230 is formed with a plurality of holes 232 (232a to 232k) and a magnetic layer 234. The plurality of holes 232a to 232k are formed corresponding to the plurality holes 222a to 222k formed on the sheet 220 and filled with a conductive paste. The magnetic layer 234 is formed between two lines of the plurality of holes 232a to 232k formed to face each other. The magnetic layer 234 may be formed by removing a corresponding portion of the sheet 230 and then filling the removed portion with a magnetic paste or a magnetic sheet. The magnetic paste may include ferrite, Ni-base, Ni—Zn-base, and Ni—Zn—Cu-base materials and the like, and the magnetic sheet includes a sheet formed of such a material.

A plurality of holes 242 (242a to 242k) and a magnetic layer 244 are also formed on the sheet 240 in the same pattern as that of the sheet 230. Also, a plurality of holes 252 (252a to 252k) and a magnetic layer 254 are formed on the sheet 250 in the same pattern as that of the sheet 230. Thus, descriptions thereof will be omitted herein. Although the common mode noise filter is configured to have three sheets respectively formed with a magnetic layer in this embodiment, the present invention is not limited thereto. That is, the common mode noise filter may be configured to have four or more of such sheets.

A plurality of internal electrodes 263 (263a to 263e) are formed on the sheet 260 to be spaced apart from one another by a predetermined distance and are obliquely formed in a left-and-lower direction to extend from positions corresponding to the plurality of holes in the first line on the respective sheets 220, 230, 240 and 250 to positions corresponding to the plurality of holes in the second line thereon. That is, describing in connection with the holes 252a to 252k formed on the sheet 250, the internal electrode 263a is formed to extend from a position corresponding to the hole 252a to a position corresponding to the hole 252g, the internal electrode 263b is formed to extend from a position corresponding to the hole 252b to a position corresponding to the hole 252h, and the internal electrode 263c is formed to extend from a position corresponding to the hole 252c to a position corresponding to the hole 252i. The internal electrode 263d is formed to extend from a position corresponding to the hole 252d to a position corresponding to the hole 252j, and the internal electrode 263e is formed to extend from a position corresponding to the hole 252e to a position corresponding to the hole 252k. The plurality of internal electrodes 261a to 261e are formed of a conductive paste.

Meanwhile, the plurality of internal electrodes 221a to 221d and 223a to 223d formed on the sheet 220 and the plurality of internal electrodes 263a to 263e formed on the sheet 260 are respectively formed of a conductive paste by a screen printing method. In addition, a sputtering method, an evaporation method, a sol-gel coating method or the like may be employed. Each of the plurality of holes formed on the sheets 220, 230, 240 and 250 is filled with a conductive paste. Thus, the common mode noise filter is formed to have a screw-thread-shaped coil wound around the magnetic layers 233, 243 and 253 formed in the short side direction of the sheets.

The ESD protection device 300 is configured by laminating a plurality sheets 310, 320, 330, 340 and 350, each of which is optionally formed with internal electrodes and holes.

A plurality of internal electrodes 311 and 312 are formed on a bottom surface of the sheet 310. The plurality of internal electrodes 311 and 312 are formed in a shape of a straight line extending from a central portion of the bottom surface of the sheet 310 to be exposed at one long side of the sheet and are spaced apart from each other.

The sheet 320 is formed with a plurality of holes 323 and 324, which are respectively formed at positions corresponding to the plurality of internal electrodes 311 and 312 formed extending from the central portion of the sheet 310. That is, the plurality of holes 323 and 324 are formed at the central portion of the sheet 320 to be spaced apart from each other. Further, each of the plurality of holes 323 and 324 is filled with an ESD protection material.

Internal electrodes 331 and 332 are formed on top and bottom surfaces of the sheet 330, respectively. The internal electrodes 331 and 332 are formed at positions corresponding to each other on the top and bottom surfaces of the sheet 330 to have a shape of a straight line to be exposed at central portions of one and the other short sides of the sheet 330 while passing through positions of the sheet 330 respectively corresponding to the positions at which the holes 323 and 324 of the sheet 320 are formed.

The sheet 340a is formed with a plurality of holes 343 and 344, which are respectively formed at positions corresponding to the plurality of holes 323 and 324 formed on the sheet 320. Further, each of the plurality of holes 343 and 344 is filled with an ESD protection material.

A plurality of internal electrodes 351 and 352 are formed on the sheet 350. The plurality of internal electrodes 351 and 352 are formed to extend to the other long side of the sheet 350 opposite to the one long side of the sheet 310 where the internal electrodes 311 and 312 are exposed. The internal electrode 351 is formed in a shape of a straight line extending from a predetermined region of the sheet 350 corresponding to the holes 323 and 343 to be exposed at the other long side of the sheet 350. In addition, the internal electrode 352 is formed in a shape of a straight line extending from a predetermined region of the sheet 350 corresponding to the holes 324 and 344 to be exposed at the other long side of the sheet 350. The internal electrodes 351 and 352 are spaced apart from each other by a predetermined distance.

Meanwhile, each of the internal electrodes 311, 312, 331, 332, 351 and 352 is formed of a conductive paste by a screen printing method. In addition, a sputtering method, an evaporation method, a sol-gel coating method or the like may be employed. Each of the holes 323, 324, 343 and 344 is filled with an ESD protection material. Here, the ESD protection material may include a mixture in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Further, the ESD protection material may be obtained by further mixing a varistor material such as ZnO or an insulating ceramic material such as $Al_2O_3$ with the mixture.

The ESD protection material described above exists in a state where conductive and insulating materials are mixed at a predetermined ratio. That is, conductive particles are distributed in the insulating material. Thus, an insulating state is maintained if a voltage lower than a predetermined value is applied to the internal electrode, while discharge is generated between the conductive particles to thereby reduce a voltage difference between corresponding internal electrodes if a voltage higher than a predetermined value is applied to the internal electrodes.

Meanwhile, the internal electrode 221a of the common mode noise filter 200 and the internal electrode 351 of the ESD protection device 300 are connected to the external electrode 500a, and the internal electrode 221b of the common mode noise filter 200 and the internal electrode 352 of the ESD protection device 300 are connected to the external electrode 500b. The internal electrode 221c of the common mode noise filter 200 and the internal electrode 311 of the ESD protection device 300 are connected to the external electrode 500c, and the internal electrode 221d of the common mode noise filter 200 and the internal electrode 312 of the ESD protection device 300 are connected to the external electrode 500d. In addition, one and the other sides of each of the internal electrodes 331 and 332 are connected to the external electrodes 600a and 600b, respectively.

As described above, in the circuit protection device according to the third exemplary embodiment of the present invention, which is a composite device of the ESD protection device and the common mode noise filter that has the screwthread-shaped coil surrounding the magnetic core formed by laminating the magnetic layers formed in a plurality of sheets, the external electrodes 500 are connected between a system and 1-channel input/output terminal used in an electronic device, and the external electrodes 600 are connected to ground terminals, so that it is possible to remove common mode noises and flow static electricity introduced into the input/output terminals into the ground terminals, as shown in the equivalent circuit diagram of FIG. 3. That is, the common mode noise filter having the coil surrounding the magnetic core is disposed between input/output terminals and a system to prevent common mode noises. Also, the ESD protection device is connected to the ground terminals between the input/output terminals and the system, so that if an undesired voltage higher than a predetermined value is applied to both ends of the circuit protection device, discharge is generated between the conductive particles in the ESD protection material to flow a current into the ground terminals, so that a voltage difference between both ends of the corresponding circuit protection device is reduced. At this time, since both ends of the circuit protection device are not electrically conductive to each other, input signals are transmitted to the input/output terminals as they are without distortion. That is, even when static electricity is generated, it is discharged to the ground terminals through the corresponding protection circuit device, so that the circuit is protected and signals received and transmitted by the system is maintained as they are.

In the circuit protection device configured as described above, since the width of the through holes of the ESD protection device filled with an ESD protection material is as narrow as several μm to several hundreds of μm, capacitance of the ESD protection device can be adjusted, for example, to 10 pF or less, preferably 1 pF or less. Thus, in the circuit protection device, capacitance at the input/output terminals using a high frequency is not changed, and signal distortion caused by the change of the capacitance is not generated.

Figure 10:
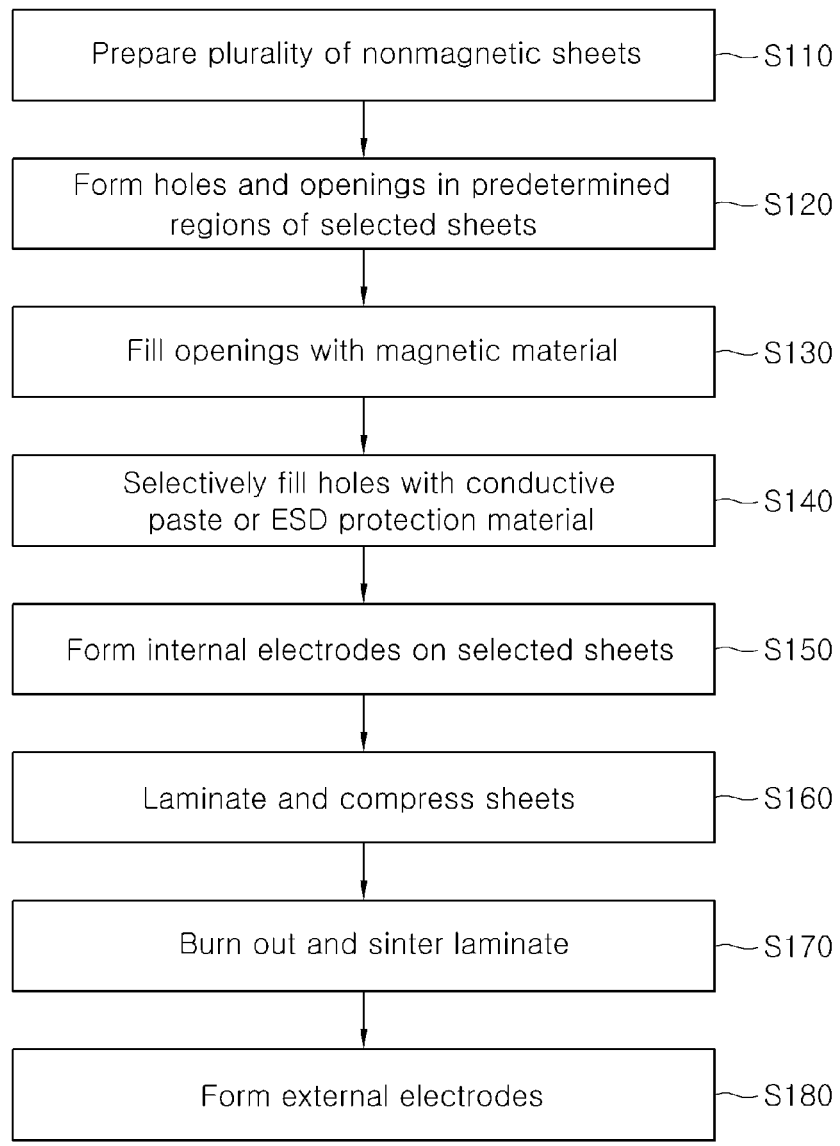
FIG. 10 is a flowchart illustrating a method of manufacturing the circuit protection device according to the third exemplary embodiment of the present invention.

Hereinafter, a method of manufacturing the aforementioned circuit protection device formed by laminating a common mode noise filter and an ESD protection device according to the third exemplary embodiment of the present invention will be described with reference to the process flowchart of FIG. 10.

S110: A plurality of rectangular sheets in which a nonmagnetic material is mixed are prepared. For this, raw material is prepared by mixing a material having a thermal expansion coefficient similar to that of ferrite, among $B_2O_3$—$SiO_2$-based glass, $Al_2O_3$—$SiO_2$-based glass and other ceramic materials, with a composition including $Al_2O_3$, glass frit and the like; and ball milling the mixture with a solvent such as alcohol for 24 hours. Then, slurry is prepared by measuring an organic binder as an additive of about 6 wt % with respect to the raw material; dissolving the organic binder in a toluene/alcohol-based solvent to be input into the raw material; and milling and mixing the raw material into which the additive is input using a small ball mill for about 24 hours. Thereafter, a sheet having a desired thickness is manufactured using the slurry by a doctor blade method or the like.

S120: A plurality of holes are formed in a predetermined region of a selected sheet and an opening having a predetermined width and length is formed thereon. That is, the plurality of symmetric holes are formed in two lines on each sheet 220, 230, 240 or 250 which is used for the common mode noise filter 200, and the opening is formed between the plurality of holes symmetrically formed on each sheet 230, 240 or 250. The holes 323, 324, 343 and 344 are formed on the sheets 320 and 340 of the ESD protection device 300. The plurality of holes and openings are formed to have a size of several μm to several hundreds of μm using a laser punching or a mechanical punching method or the like. Of course, the opening is formed to larger than the hole.

S130: The opening formed in a central portion of each sheet 220, 230 or 240 for the common mode noise filter 200 is filled with a magnetic paste or a magnetic sheet, whereby the magnetic layers 234, 244 and 254 are formed. Here, the magnetic sheet is manufactured by mixing a magnetic material such as a ferrite, Ni-base, Ni—Zn-based, or Ni—Zn—Cu-based material instead of a nonmagnetic material of step S110 of preparing raw material powder and then by performing subsequent processes. The magnetic sheet is cut at a size corresponding to the opening, and fills the openings.

S140: The plurality of holes formed on the plurality of sheets 220, 230, 240 and 250 to be used for the common mode noise filter 200 are filled with a conductive paste such as Pd, Ag/Pd or Ag. In addition, the holes 323, 324, 343 and 344 formed on the sheets 330 and 340 to be used for the ESD protection device are filled with an ESD protection material. The ESD protection material may be formed of a material in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Meanwhile, the ESD protection material may be obtained by further mixing a varistor material such as ZnO or an insulating ceramic material such as $Al_2O_3$ with the mixture.

S150: Internal electrodes are formed on the sheets selected to implement the common mode noise filter 200 and the ESD protection device 300. That is, a conductive paste such as Pd, Ag/Pd or Ag is printed on the sheets 220 and 260 and the sheets 310, 330 and 350, for example, by a screen printing method, thereby forming the internal electrodes for implementing the common mode noise filter 200 and the ESD protection device 300.

S160: A rectangular hexahedral laminate is manufactured by laminating the upper cover layer 100, the sheets 210, 220, 230, 240, 250 and 260, the sheets 310, 320, 330, 340 and 350, and the lower cover layer 200, compressing the laminated sheets at a pressure of 200 to 700 kgf/cm², and then cutting the laminate at a desired unit chip size. Dummy sheets may be further inserted between the upper cover layer 100 and the sheet 210 and between the sheet 350 and the lower cover layer 400. In addition, each of the upper and lower cover layers 100 and 400 may be formed by laminating a plurality of nonmagnetic sheets.

S170: Continuously, the sheet laminate is burnt-out in a furnace at a temperature of 230 to 350° C. for 20 to 40 hours to remove binder components and then sintered at a temperature of 700 to 900° C. for 20 to 40 hours. Here, since in the circuit protection device according to the present invention, the sheets for the upper cover layer, the common mode noise filter, the ESD protection device and the lower cover layer are the same, the sheets can be simultaneously sintered, and thus, a manufacturing process of the circuit protection device can be simplified.

S180: The external electrodes 500 and 600 are formed on the outer surface of the sheet laminate sintered in the furnace, and then sintering is performed at a temperature of 600 to 800° C. for 30 minutes to 2 hours, thereby the circuit protection device according to the first exemplary embodiment of the present invention is completed. Here, the external electrodes 500 are connected to internal electrodes 221*a*, 221*b*, 221*c* and 221*d* of the common mode noise filter 200 and the internal electrodes 311, 312, 351 and 352 of the ESD protection device 300. Also, the external electrodes 600 are connected to the internal electrodes 331 and 332 of the ESD protection device 300.

Figure 11:
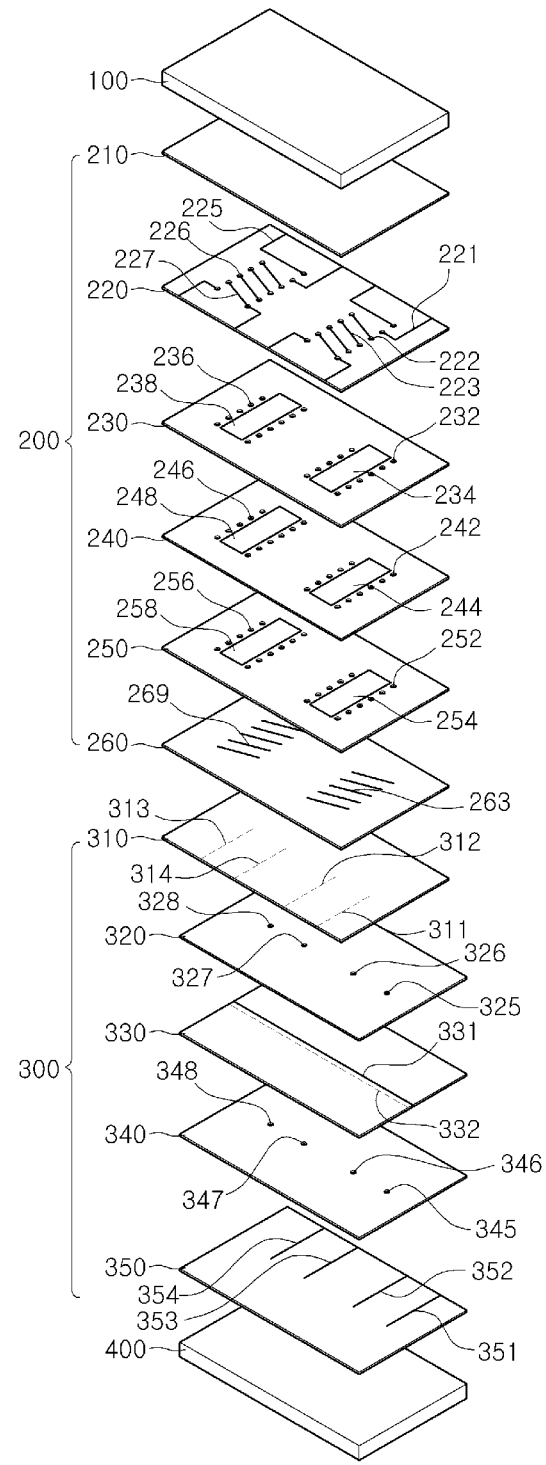
FIG. 11 is an exploded perspective view of the circuit protection device according to a fourth exemplary embodiment of the present invention.

FIG. 11 is an exploded perspective view of a circuit protection device according to a fourth exemplary embodiment of the present invention. A perspective view showing an assembled state of the circuit protection device according to the fourth exemplary embodiment of the present invention is identical to FIG. 5. In the circuit protection device according to the fourth exemplary embodiment of the present invention, a common mode noise filter 200 is formed to have two screw-thread-shaped coils respectively wound around two magnetic cores. A sheet 220 is formed with holes 222 and 226 in four lines, so that internal electrodes 223 and 227, and internal electrodes 221 and 225 are formed. The internal electrodes 223 and 227 connect the holes in two lines in a right-and-lower direction, and the internal electrodes 221 and 225 extend to the outside. Each of sheets 230, 240 and 250 is formed with holes 232 and 236, 242 and 246, or 252 and 256 arranged in four lines, and two magnetic layers 234 and 238, 244 and 248, or 254 and 258, each of which is formed between the holes in the two lines. A sheet 260 is formed with a plurality of internal electrodes 263 and 269 arranged in the two lines. Eight external electrodes 500 (500a to 500h) and two external electrodes 600 (600a and 600b) are formed. Further, in an ESD protection device 300, four internal electrodes are formed on each of bottom and top surfaces of sheets 310 and 350, four holes are formed on each of the sheets 320 and 340, and internal electrodes are formed on top and bottom surfaces of a sheet 330, respectively.

As described above, in the circuit protection device according to the second exemplary embodiment of the present invention, which is a composite device of the common mode noise filter and the ESD protection device, the external electrodes 500 of the circuit protection device are connected to a system and two-channel input/output terminals, which are used in an electronic device, and the external electrodes 600 are connected to ground terminals, as shown in FIG. 7, so that it is possible to remove common mode noises and allow static electricity introduced into the input/output terminals to flow into the ground terminals. In addition, common mode noises and ESD inputted through many channels can be prevented using one circuit protection device although the number of channels is increased, so that the number of circuit protection devices can be decreased, and thus, the size of electronic devices can be reduced.

Figure 12:
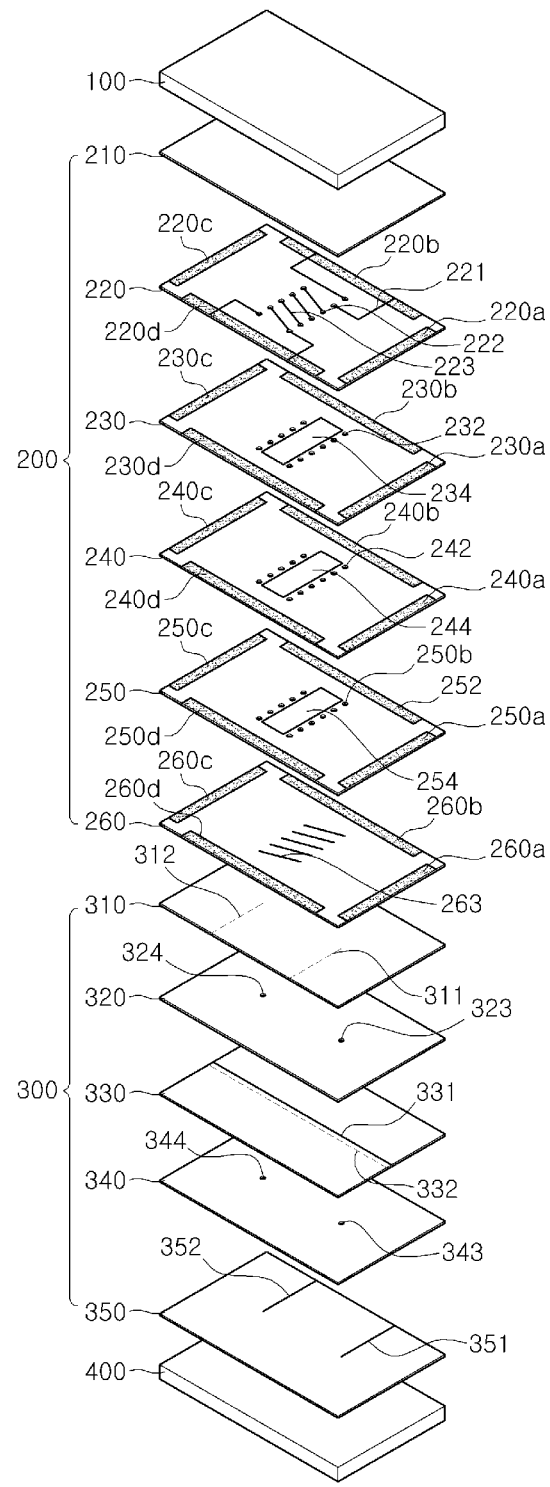
FIG. 12 is an exploded perspective view of a circuit protection device according to a fifth exemplary embodiment of the present invention.

FIG. 12 is an exploded perspective view of a circuit protection device according to a fifth exemplary embodiment of the present invention. The circuit protection device according to the fifth exemplary embodiment of the present invention is different from the circuit protection device according to the third exemplary embodiment of the present invention shown in FIG. 8 in that magnetic layers 220a to 220d, 230a to 230d, 240a to 240d, 250a to 250d, or 260a to 260d are formed on four sides of each of the sheets 220 to 260, except a cover sheet 210, of a common mode noise filter 200 not to be connected to one another. If magnetic layers are formed on the four sides of each of the sheets 220 to 260 of the common mode noise filter 200 as described above, magnetic flux can be prevented from leaking.

Meanwhile, it will be apparent that the magnetic layers formed on the four sides of each of the sheets 220 to 260 of the common mode noise filter 200 may be applied to the sheets of the common mode noise filters of the circuit protection devices according to the second exemplary embodiment of the present invention as well as the first embodiment.

Figure 13:
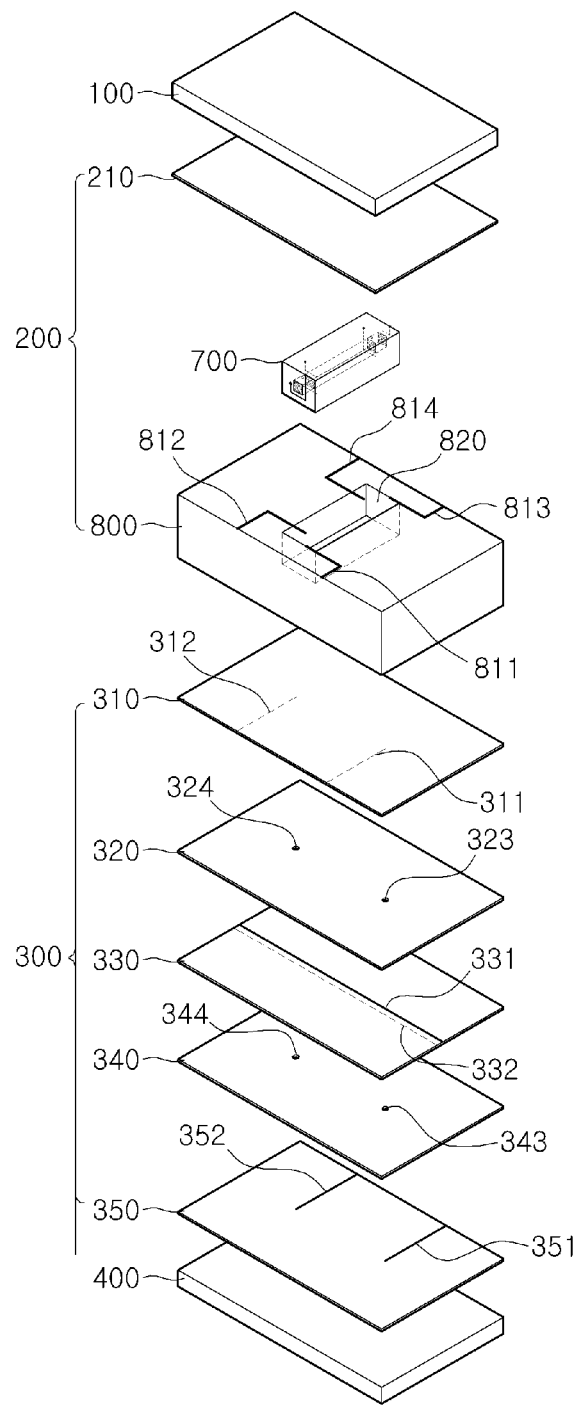
FIG. 13 is an exploded perspective view of a circuit protection device according to a sixth exemplary embodiment of the present invention.
Figure 14:
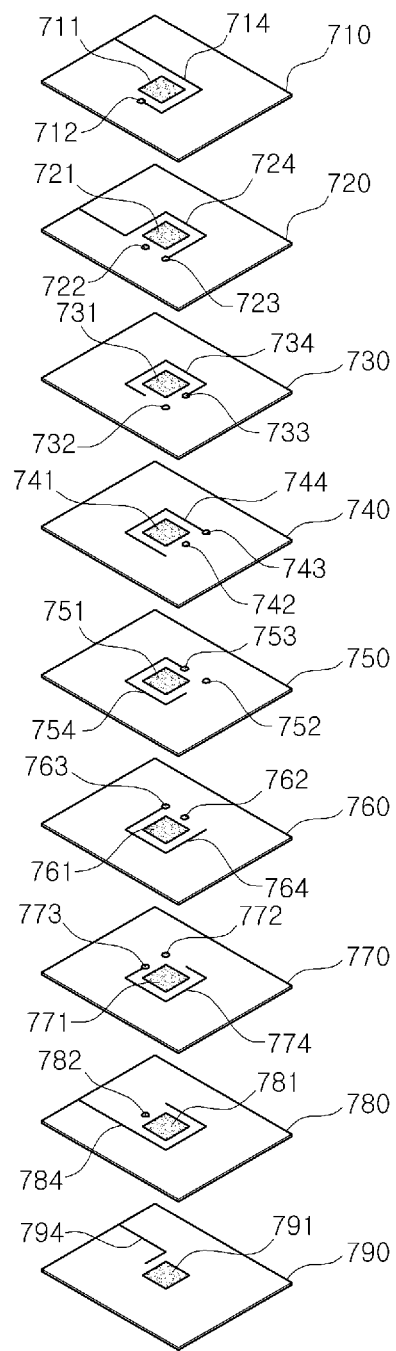
FIG. 14 is an exploded perspective view of a coil unit of the circuit protection device according to the sixth exemplary embodiment of the present invention.

FIGS. 13 and 14 are an exploded perspective view of a circuit protection device and an exploded perspective view of a coil unit according to a sixth exemplary embodiment of the present invention, respectively. A perspective view showing an assembled state of the circuit protection device according to the sixth exemplary embodiment of the present invention is the same as that of FIG. 1.

Referring to FIGS. 1 and 13, the circuit protection device according to the sixth exemplary embodiment of the present invention is formed by laminating a plurality of insulating sheets including an upper cover layer 100, a common mode noise filter 200, an ESD protection device 300 and a lower cover layer 400. The circuit protection device may further include external electrodes 500 (500a, 500b, 500c and 500d) connected to some of internal electrodes of the common mode noise filter 200 and some of internal electrodes of the ESD protection device 300, and external electrodes 600 (600a and 600b) connected to some of internal electrodes of the ESD protection device 300. In addition, the plurality of sheets of the upper cover layer 100, the common mode noise filter 200, the ESD protection device 300 and the lower cover layer 400 may be formed of a nonmagnetic sheet. Meanwhile, the plurality of sheets of the upper and lower cover layers 100 and 400 may be formed of a magnetic sheet.

The common mode noise filter 200 comprises a cover sheet 210, a coil unit 700 having a structure, for example, in a shape of a rectangular hexahedron, in which a coil is wound around a magnetic core that is formed by laminating a plurality of sheets, and a coil insertion unit 800 formed by laminating a plurality of sheets to have a space for receiving the coil unit.

The cover sheet 210 is formed of a nonmagnetic sheet and serves to protect the coil insertion unit 800 into which the coil unit 700 is inserted.

The coil unit 700 is formed by laminating a plurality of sheets 710 to 790, and has a structure, for example, in a shape of a rectangular hexahedron, in which openings formed at the centers of the respective sheets 710 to 790 are filled with a magnetic material to thereby form magnetic layers and internal electrodes of a conductive material is connected through holes to form a coil surrounding the magnetic layers. Here, the sides of each of the magnetic layers and the sheets will be referred to as first, second, third and fourth sides counterclockwise from a base side for convenience of illustration.

The sheet 710 is formed with a magnetic layer 711, a hole 712 which is filled with a conductive paste, an internal electrode 714. Preferably, the magnetic layer 711 is formed in a central portion of the sheet 710 in such manner that a square opening with a predetermined size is bored vertically through the central portion of the sheet 710 and filled with a magnetic paste or a magnetic sheet. The magnetic paste may include ferrite, Ni-based, Ni-Zn-based, and Ni—Zn—Cu-based materials and the like, and the magnetic sheet includes a sheet manufactured using such a material. The hole 712 is spaced apart from the magnetic layer 711 by a predetermined distance. For example, the hole 712 is spaced apart from the center of the first side of the magnetic layer 711 by a predetermined distance and filled with a conductive paste. The internal electrode 714 is formed to surround the first, second and third sides of the magnetic layer 711 starting from the hole 712 while maintaining a constant gap from the magnetic layer 711. The internal electrode is formed extending in parallel with the third side of the magnetic layer 711 to be exposed at the fourth side of the sheet 710.

The sheet 720 is formed with a magnetic layer 721, holes 722 and 723 which are filled with a conductive paste, and an internal electrode 724. The magnetic layer 721 is formed in a portion corresponding to the magnetic layer 711 formed in the sheet 710, i.e., in a central portion of the sheet 720. The hole 722 is formed at a position corresponding to the hole 712 formed on the sheet 710, i.e., at a position spaced apart from the center of the first side of the magnetic layer 721 by a predetermined distance, and the hole 723 is spaced apart from the hole 722 by a predetermined distance. For example, the hole 723 is spaced apart from the vertex made by the first and second sides of the magnetic layer 721 by a predetermined distance. The holes 722 and 723 are filled with a conductive paste. Starting from the hole 723, the internal electrode 724 is formed surrounding the second, third and fourth sides of the magnetic layer 721 while maintaining a constant gap from the magnetic layer 721. The internal electrode 724 corresponds to the vertex made by the third and fourth sides of the magnetic layer 721 and is formed to be exposed at the fourth side of the sheet 720.

The sheet 730 is formed with a magnetic layer 731, holes 732 and 733 which are filled with a conductive paste, and an internal electrode 734. The magnetic layer 731 is formed in a central portion of the sheet 730. The hole 732 is formed at a position corresponding to the hole 723 formed on the sheet 720, i.e., at a position spaced apart from the vertex made by the first and second sides of the magnetic layer 731 by a predetermined distance, and the hole 733 is space apart from the hole 732 by a predetermined distance. The hole 733 is spaced apart from the center of the second side of the magnetic layer 731 by a predetermined distance. The holes 732 and 733 are filled with a conductive paste. Starting from the hole 733, the internal electrode 734 is formed to surrounding the second side, third, fourth, and first sides of the magnetic layer 731 while maintaining a constant gap from the magnetic layer 731. The internal electrode 734 is formed up to a portion corresponding to the center of the first side of the magnetic layer 731. That is, the internal electrode 734 is formed up to a portion corresponding to the hole 722 of the sheet 720.

The sheet 740 is formed with a magnetic layer 741, holes 742 and 743 which are filled with a conductive paste, and an internal electrode 744. The magnetic layer 741 is formed in a central portion of the sheet 740. The hole 742 is spaced apart from a position corresponding to the hole 733 formed on the sheet 730, i.e., from the center of a second side of the magnetic layer 741 by a predetermined distance, and the hole 743 is spaced apart from the hole 742 by a predetermined distance. The hole 743 is spaced apart from the vertex made by the second and third sides of the magnetic layer 741 by a predetermined distance. The holes 742 and 743 are filled with a conductive paste. Starting from the hole 743, the internal electrode 744 is formed surrounding the third, fourth and first sides of the magnetic layer 741 while maintaining a constant gap from the magnetic layer 741. The internal electrode 744 is formed up to a portion corresponding to the vertex made by the first and second sides of the magnetic layer 741. That is, the internal electrode 744 is formed up to a portion corresponding to the hole 732 of the sheet 730.

The sheet 750 is formed with a magnetic layer 751, holes 752 and 753 which are filled with a conductive paste, and an internal electrode 754. The magnetic layer 751 is formed in a central portion of the sheet 750. The hole 752 is formed at a position corresponding to the hole 743 formed on the sheet 740, i.e., at a position spaced apart from the vertex made by the second and third sides of the magnetic layer 751 by a predetermined distance, and the hole 753 is spaced apart from the hole 752 by a predetermined distance. The holes 752 and 753 are filled with a conductive paste. Starting from the hole 753, the internal electrode 754 is surrounding the third, fourth, first and second sides of the magnetic layer 751 while maintaining a constant gap from the magnetic layer 751. That is, the internal electrode 754 is formed from the hole 753 up to a portion of the second side of the sheet 750 corresponding to the hole 742 of the sheet 740.

The sheet 760 is formed with a magnetic layer 761, holes 762 and 763 which are filled with a conductive paste, and an internal electrode 764. The magnetic layer 761 is formed in a central portion of the sheet 760. The hole 762 is formed at a position corresponding to the hole 753 formed on the sheet 750, i.e., at a position spaced apart from the center of the third side of the magnetic layer 761 by a predetermined distance, and the hole 763 is spaced apart from the hole 762 by a predetermined distance. The hole 763 is spaced apart from the vertex made by the third and fourth sides of the magnetic layer 761 by a predetermined distance. The holes 762 and 763 are filled with a conductive paste. Starting from the hole 763, the internal electrode 764 is formed surrounding the fourth, first and second sides of the magnetic layer 761 while maintaining a constant gap from the magnetic layer 761. That is, the internal electrode 764 is formed from the hole 763 up to a position of the vertex made by the second and third sides of the sheet 760 corresponding to the hole 752 of the sheet 750.

The sheet 770 is formed with a magnetic layer 771, holes 772 and 773 which are filled with a conductive paste, and an internal electrode 774. The magnetic layer 771 is formed in a central portion of the sheet 770. The hole 772 is formed at a position corresponding to the hole 763 formed on the sheet 760, i.e., at a position spaced apart from the vertex made by the third and fourth sides of the magnetic layer 771 by a predetermined distance, and the hole 773 is spaced apart from the hole 772 by a predetermined distance. The hole 773 is spaced apart from the center of the fourth side of the magnetic layer 771 by a predetermined distance. The holes 772 and 773 are filled with a conductive paste. Starting from the hole 773, the internal electrode 774 is formed surrounding the fourth, first, second and third sides of the magnetic layer 771 while maintaining a constant gap from the magnetic layer 771. That is, the internal electrode 774 is formed from the hole 773 up to a position of the center of the third side of the magnetic layer 771 corresponding to the hole 762 of the sheet 760.

The sheet 780 is formed with a magnetic layer 781, a hole 782 which is filled with a conductive paste, and an internal electrode 784. The magnetic layer 781 is formed in a central portion of the sheet 780. The hoe 782 is formed at a position corresponding to the hole 773 formed on the sheet 770, i.e., at a position spaced apart from the center of the fourth side of the magnetic layer 781 by a predetermined distance. The hole 782 is filled with a conductive paste. The internal electrode 784 is formed surrounding the third, second and first sides of the magnetic layer 781 while being spaced apart from a position corresponding to the hole 772 of the sheet 770, i.e., a position of the vertex made by the third and fourth sides of the magnetic layer 781 by a predetermined distance. The internal electrode 784 extends in parallel with the first side of the magnetic layer 781 to be exposed at the fourth side of the sheet 780.

A magnetic layer 791 is formed at a central portion of the sheet 790. An 7internal electrode 794 is formed along the magnetic layer 791 from a position corresponding to the hole 782 of the sheet 780, i.e., from a position of the center of the fourth side of the magnetic layer 791 to the vertex made by the third and fourth sides of the magnetic layer 791, and formed to be exposed at the fourth side of the sheet 490.

Meanwhile, the plurality of internal electrodes 714 to 794 respectively formed on the sheets 710 to 790 are respectively formed of a conductive paste by a screen printing method. In addition, a sputtering method, an evaporation method, a sol-gel coating method or the like may be employed. The sheets 710 to 790 are laminated, so that the magnetic layers 711 to 791 formed in the same position become a magnetic core, and a coil pattern is formed so that the internal electrodes connected to each other through the holes are wound around the magnetic core. That is, the internal electrode 714 exposed to the outside is connected to the internal electrode 734 through the holes 712 and 722, the internal electrode 734 is connected to the internal electrode 754 of the sheet 750 through the holes 733 and 742, the internal electrode 754 is connected to the internal electrode 774 through the holes 753 and 762, and the internal electrode 774 is connected to the internal electrode 794 exposed to the outside through the holes 773 and 782. The internal electrode 724 exposed to the outside is connected to the internal electrode 744 through the holes 723 and 732, the internal electrode 744 is connected to the internal electrode 764 through the holes 743 and 752, and the internal electrode 764 is connected to the internal electrode 784 exposed to the outside through the holes 763 and 772.

The coil insertion unit 800 is formed by laminating the plurality of sheets which is provided with a space, into which the coil unit is inserted, in a central portion thereof. That is, the coil insertion unit 800 is formed by laminating the plurality of sheets, each of which has an opening with the size of the coil unit 700 in a central portion thereof. Preferably, the coil insertion unit 800 is formed at the same thickness as the width of the coil unit 700. A plurality of internal electrodes 811 to 814 are formed on the uppermost sheet of the coil insertion unit 800. The internal electrode 811 is connected to the internal electrode 714 of the coil unit 700, the internal electrode 812 is connected to the internal electrode 724 of the coil unit 700, and the internal electrode 813 is connected to the internal electrode 794 of the coil unit 700. Further, the internal electrode 814 is connected to the internal electrode 784 of the coil unit 700. Thus, the coil unit 700 is inserted into an insertion space 820 of the coil insertion unit 800 such that the fourth side of the sheets of the coil unit 700 at which the internal electrodes 714, 724, 784 and 794 are exposed faces upward. Meanwhile, no coil insertion space may be formed in the lowermost sheet among the plurality of sheets of the coil insertion unit 800.

The ESD protection device 200 is configured by laminating a plurality sheets 310, 320, 330, 340 and 350, each of which is optionally formed with internal electrodes and holes.

A plurality of internal electrodes 311 and 312 are formed on a bottom surface of the sheet 310. The plurality of internal electrodes 311 and 312 are formed in a shape of a straight line extending from a central portion of the bottom surface of the sheet 310 to be exposed at one long side of the sheet and are spaced apart from each other.

The sheet 320 is formed with a plurality of holes 323 and 324, which are respectively formed at positions corresponding to the plurality of internal electrodes 311 and 312 formed extending from the central portion of the sheet 310. That is, the plurality of holes 323 and 324 are formed at the central portion of the sheet 320 to be spaced apart from each other. Further, each of the plurality of holes 323 and 324 is filled with an ESD protection material.

Internal electrodes 331 and 332 are formed on top and bottom surfaces of the sheet 330, respectively. The internal electrodes 331 and 332 are formed at positions corresponding to each other on the top and bottom surfaces of the sheet 330 to have a shape of a straight line to be exposed at central portions of one and the other short sides of the sheet 330 while passing through positions of the sheet 330 respectively corresponding to the positions at which the holes 323 and 324 of the sheet 320 are formed.

The sheet 340a is formed with a plurality of holes 343 and 344, which are respectively formed at positions corresponding to the plurality of holes 323 and 324 formed on the sheet 320. Further, each of the plurality of holes 343 and 344 is filled with an ESD protection material.

A plurality of internal electrodes 351 and 352 are formed on the sheet 350. The plurality of internal electrodes 351 and 352 are formed to extend to the other long side of the sheet 350 opposite to the one long side of the sheet 310 where the internal electrodes 311 and 312 are exposed. The internal electrode 351 is formed in a shape of a straight line extending from a predetermined region of the sheet 350 corresponding to the holes 323 and 343 to be exposed at the other long side of the sheet 350. In addition, the internal electrode 352 is formed in a shape of a straight line extending from a predetermined region of the sheet 350 corresponding to the holes 324 and 344 to be exposed at the other long side of the sheet 350. The internal electrodes 351 and 352 are spaced apart from each other by a predetermined distance.

Meanwhile, each of the internal electrodes 311, 312, 331, 332, 351 and 352 is formed of a conductive paste by a screen printing method. In addition, a sputtering method, an evaporation method, a sol-gel coating method or the like may be employed. Each of the holes 323, 324, 343 and 344 is filled with an ESD protection material. Here, the ESD protection material may include a mixture in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Further, the ESD protection material may be obtained by further mixing a varistor material such as ZnO or an insulating ceramic material such as $Al_2O_3$ with the mixture.

The ESD protection material described above exists in a state where conductive and insulating materials are mixed at a predetermined ratio. That is, conductive particles are distributed in the insulating material. Thus, an insulating state is maintained if a voltage lower than a predetermined value is applied to the internal electrodes, while discharge is generated between the conductive particles to thereby reduce a voltage difference between corresponding internal electrodes if a voltage higher than a predetermined value is applied to the internal electrodes.

Meanwhile, the internal electrode 813 of the coil insertion unit 800 of the common mode noise filter 200 and the internal electrode 351 of the ESD protection device 300 are connected to the external electrode 500a, and the internal electrode 814 of the coil insertion unit 800 of the common mode noise filter 200 and the internal electrode 352 of the ESD protection device 300 are connected to the external electrode 500b. The internal electrode 811 of the coil insertion unit 800 of the common mode noise filter 200 and the internal electrode 311 of the ESD protection device 300 are connected to the external electrode 500c, and the internal electrode 812 of the coil insertion unit 800 of the common mode noise filter 200 and the internal electrode 312 of the ESD protection device 300 are connected to the external electrode 500d. In addition, one and the other sides of each of the internal electrodes 331 and 332 are connected to the external electrodes 600a and 600b, respectively.

As described above, according to the sixth exemplary embodiment of the present invention, the circuit protection device is formed as a single chip by laminating the ESD protection device and the common mode noise filter in which the coil unit is manufactured by winding the internal electrodes around magnetic layers, through the holes, and the coil unit is inserted into the coil unit insertion space of the coil insertion unit. In the circuit protection device, the external electrodes 500 are connected between a system and 1-channel input/output terminals used in an electronic device, and the external electrodes 600 are connected to ground terminals, as shown in the equivalent circuit diagram of FIG. 4, so that it is possible to remove common mode noises and flow static electricity introduced to the input/output terminals into the ground terminals. That is, the common mode noise filter having the coil surrounding the magnetic core functions as an inductor to effectively prevent common mode noises. Also, if an undesired voltage higher than a predetermined value is applied to both ends of the circuit protection device, discharge is generated between the conductive particles in the ESD protection material and a current flows into the ground terminals, thereby a voltage difference between both ends of the corresponding circuit protection device can be reduced. At this state, since both ends of the circuit protection device are not electrically conductive to each other, input signals are transmitted to the input/output terminals as they are without distortion. That is, even when static electricity is generated, the corresponding static electricity is discharged to the ground terminals through the corresponding protection circuit device, so that the circuit is protected and signals received and transmitted by the system are maintained as they are.

In the circuit protection device configured as described above, since the width of the through holes of the ESD protection device filled with an ESD protection material is as narrow as several μm to several hundreds of μm, capacitance of the ESD protection device may be adjusted, for example, to 10 pF or less, preferably 1 pF or less. Thus, in the circuit protection device, capacitance at the input/output terminals using a high frequency is not changed, and signal distortion caused by the change of the capacitance is not generated.

Figure 15:
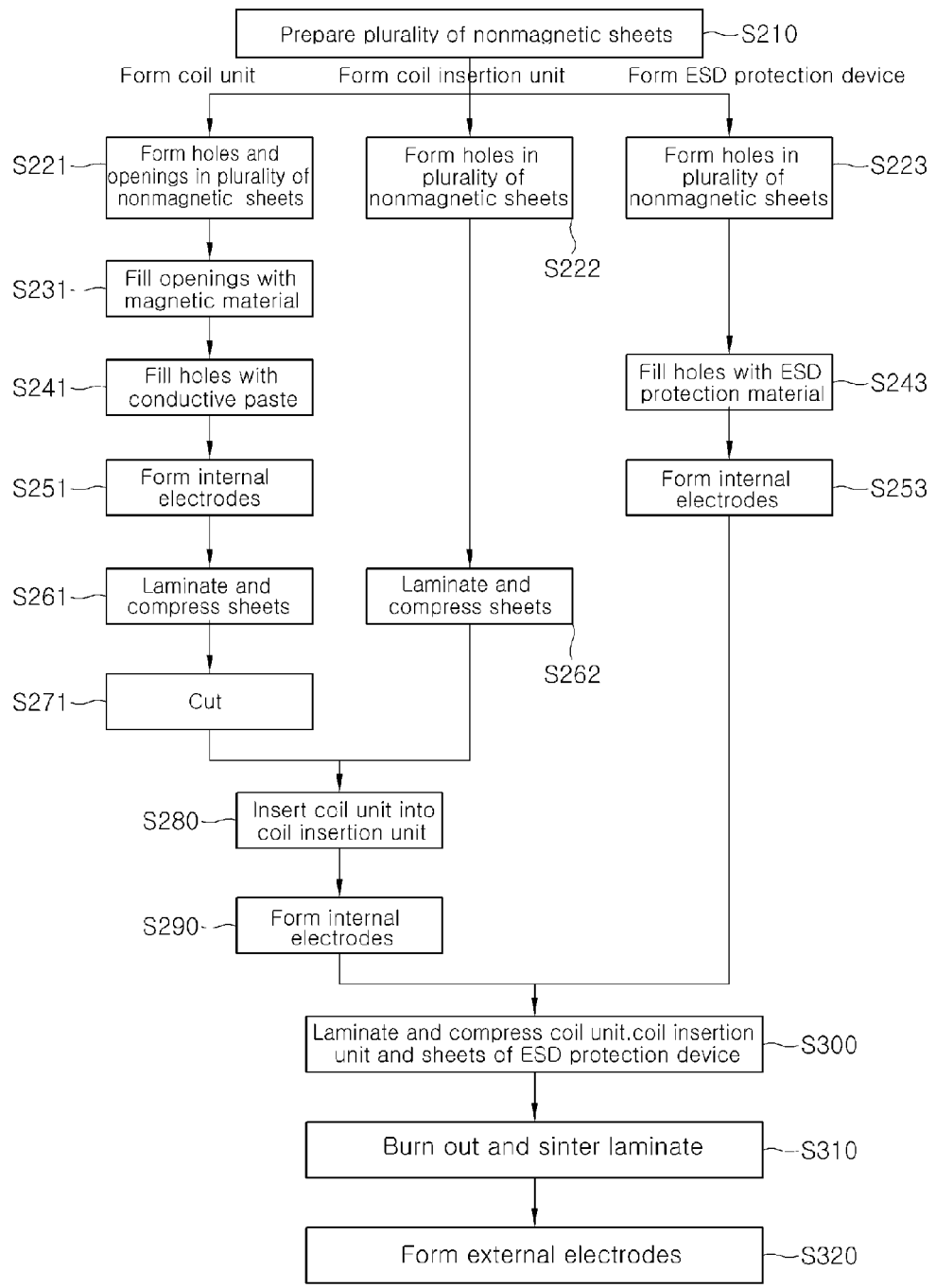
FIG. 15 is a flowchart illustrating a method of manufacturing the circuit protection device according to the sixth exemplary embodiment of the present invention.

Hereinafter, a method of manufacturing the aforementioned circuit protection device formed by laminating a common mode noise filter and an ESD protection device according to the sixth exemplary embodiment of the present invention will be described with reference to the process flowchart of FIG. 15.

A plurality of rectangular sheets in which a nonmagnetic material is mixed are prepared (S210). The nonmagnetic sheets may be prepared by the same method as the step S110 described with reference to FIG. 10. In addition, the coil unit and the coil insertion unit of the common mode noise filter and the ESD protection device are respectively formed. Processes of manufacturing them will be described in detail below.

A plurality of holes and openings are respectively formed on a plurality of selected sheets (S221, S222 and S223). That is, a plurality of holes and openings are formed on a plurality of nonmagnetic sheets selected to form the coil unit, and a plurality of openings having the size of the coil unit are formed on a plurality of nonmagnetic sheets selected to form the coil insertion unit. In addition, a plurality of holes are formed on a plurality of nonmagnetic sheets selected to form the ESD protection device. More specifically, the opening is formed at the same position on each of the plurality of nonmagnetic sheets selected to form the coil unit, and a plurality of holes are optionally formed to be spaced apart from the opening by a predetermined distance. A plurality of holes and an opening may be spaced apart from each other on one nonmagnetic sheet, and the holes and opening may be simultaneously formed. A coil insertion space having the size of the coil unit which will be formed is formed in each predetermined region of the plurality of nonmagnetic sheets selected to form the coil insertion unit. At this time, the plurality of coil insertion spaces may be formed on one nonmagnetic sheet. A plurality of holes are optionally formed on the plurality of nonmagnetic sheets selected to form the ESD protection device. At this time, the plurality of holes formed on one nonmagnetic sheet may be spaced apart from one another. Meanwhile, the plurality of holes and openings may be formed by a laser or mechanical punching method.

The magnetic layers are formed by filling the openings respectively formed on the plurality of nonmagnetic sheets selected to form the coil unit with a magnetic paste or with magnetic sheets cut to have the size of the opening (S231). Here, the magnetic paste may include ferrite, Ni-based, Ni—Zn-based, and Ni—Zn—Cu-based materials and the like. The magnetic sheet may be provided by mixing a magnetic material such as a ferrite, Ni-based, Ni—Zn-based, or Ni—Zn—Cu-based material or the like in place of a nonmagnetic material which is used while manufacturing the nonmagnetic sheets.

The plurality of holes respectively formed on the plurality of nonmagnetic sheets selected to form the coil unit are filled with a conductive paste (S241), and the plurality of holes respectively formed on the plurality of nonmagnetic sheets selected to forming the ESD protection device are filled with an ESD protection material (S243). Here, the conductive paste may include Pd, Ag/Pd, Ag and the like, and the ESD protection material may be formed of a material in which an organic material such as polyvinyl alcohol (PVA) or polyvinyl butyral (PVB) is mixed with one conductive material selected from $RuO_2$, Pt, Pd, Ag, Au, Ni, Cr, W and combinations thereof. Meanwhile, the ESD protection material may be obtained by further mixing a varistor material such as ZnO or an insulating ceramic material such as $Al_2O_3$ with the mixture.

The internal electrodes are respectively formed on the plurality of nonmagnetic sheets selected to form the coil unit (S251), and the internal electrodes are respectively formed on the plurality of nonmagnetic sheets selected to form the ESD protection device (S253). These internal electrodes are formed by printing a conductive paste such as Pd, Ag/Pd or Ag using a screen printing method or the like.

The respective plurality of nonmagnetic sheets selected to form the coil unit are laminated and then compressed (S261), and the respective plurality of nonmagnetic sheets selected to form the coil insertion unit are laminated and then compressed (S262). At this time, in the plurality of nonmagnetic sheets laminated to form the coil insertion unit, a sheet with no opening is used as the lowermost sheet, so that the bottom of the coil unit is not exposed to the outside and is safely rested on the lowermost sheet after the coil unit is fastened to the coil insertion unit.

The plurality of nonmagnetic sheets laminated and compressed to form the coil unit are cut at a predetermined size (S271). Thus, the coil unit having a coil is formed by connecting the internal electrodes through the holes to be wound around the magnetic layers constituting a magnetic core.

The direction of the coil unit is adjusted such that the internal electrodes exposed to the outside of the coil unit are connected to the internal electrodes of the coil insertion unit, and the coil unit is then inserted into the coil insertion space of the coil insertion unit (S280).

The internal electrodes are formed on the uppermost sheet of the coil insertion unit to be connected to the internal electrodes exposed to the outside of the coil unit (S290). Here, the internal electrodes are formed to extend up to the coil unit to be connected to the internal electrodes exposed to the outside of the coil unit and formed to extend to one and the other surfaces of the coil insertion unit.

A rectangular hexahedral laminate is manufactured by matching the coil unit into the coil insertion space of the plurality of sheets of the coil insertion unit, laminating the plurality of sheets selected to form the ESD protection device and the plurality of sheets used as upper and lower cover layers, compressing them under a predetermined pressure, and then cutting the laminate at a desired unit chip size (S300). At this time, a dummy sheet may be further interposed between the upper cover layer and the common mode noise filter, and a dummy sheet may be further interposed between the ESD protection device and the low cover layer.

The sheet laminate is burnt-out in a furnace, for example, at a temperature of 230 to 350° C. for 20 to 40 hours to remove binder components, and then sintered, for example, at a temperature of 700 to 900° C. for 20 to 40 hours (S310). Here, in the circuit protection device according to the present invention, since the sheets for the upper cover layer, the common mode noise filter, the ESD protection device and the lower cover layer are the same, the sheets can be simultaneously sintered, and thus, a manufacturing process of the circuit protection device can be simplified.

The external electrodes are formed on outer surface of the sheet laminate sintered in the furnace (S320) and then sintered at a temperature of 600 to 800° C. for 30 minutes to 2 hours, thereby completing the circuit protection device according to the sixth exemplary embodiment of the present invention.

Meanwhile, the circuit protection device manufactured as described above according to the sixth exemplary embodiment of the present invention may be connected to input/output terminals with 2- or more channels by applying the fourth exemplary embodiment of the present invention described with reference to FIG. 11. In this case, at least two coil insertion spaces 820 may be formed in the coil insertion unit 800, and at least two coil units 700 may be inserted into the coil insertion spaces 820, respectively. That is, like the fourth exemplary embodiment of the present invention shown in FIG. 11, in the common mode noise filter 200, at least two coil units 700 are inserted into the coil insertion unit provided with at least two coil insertion spaces 820, and internal electrodes are formed in the coil insertion unit 800 to be connected to internal electrodes exposed to the outside of the coil units 700. The internal electrodes are laminated and joined, and eight external electrodes are formed as shown in FIG. 6. In this case, common mode noises and ESD inputted through many channels can be prevented using one circuit protection device although the number of channels is increased, so that the number of circuit protection devices can be decreased, and thus, the size of electronic devices can be reduced.

By applying the fifth exemplary embodiment of the present invention described with reference to FIG. 12, magnetic layers can be formed at four sides of the plurality of sheets of the coil unit according to the sixth exemplary embodiment of the present invention such that the magnetic layers are not connected to one another. The magnetic layers are formed at the four sides of the plurality of sheets 710 to 790 of the coil unit 700, thereby preventing leakage of magnetic flux.

Meanwhile, it will be apparent that the magnetic layers formed at the four sides of the plurality of sheets of the coil unit in the common mode noise filter 200 may be applied when the sheet 330 having the internal electrode 331 connected to the external electrode 600 of a multi-channel circuit protection device and the ESD protection device 300 is formed in plurality.

The invention claimed is:

1. A method of manufacturing a circuit protection device, comprising:
preparing a plurality of nonmagnetic sheets;
optionally forming holes in the plurality of nonmagnetic sheets;
optionally filling the holes of the plurality of nonmagnetic sheets with a magnetic material, a conductive material or an ESD protection material;
optionally forming internal electrodes or coil patterns on the plurality of nonmagnetic sheets;
laminating and compressing the nonmagnetic sheets and then cutting the laminate; and
sintering the laminated and cut magnetic sheets;
wherein a common mode noise filter and an ESD protection device are laminated.

2. The method of manufacturing a circuit protection device of claim 1, wherein the common mode noise filter is formed by optionally forming a plurality of coil patterns, internal electrodes, holes filled with a conductive material, and holes filled with a magnetic material on the plurality of nonmagnetic sheets, wherein the holes filled with a magnetic material are formed to be connected up and down, and the coil patterns are formed to be connected up and down by at least one hole filled with a conductive material and to surround the holes filled with a magnetic material.

3. The method of manufacturing a circuit protection device of claim 2, wherein the ESD protection device is formed by optionally forming a plurality of internal electrodes and holes filled with an ESD protection material on each of the nonmagnetic sheets, wherein the holes filled with an ESD protection material are connected to the internal electrodes.

4. The method of manufacturing a circuit protection device of claim 3, further comprising forming first external electrodes on a first side and a second side opposite the first side of the laminated magnetic sheets, and forming second external electrodes on a third side and a fourth side opposite the third side which are intersected with the first and second sides.

5. The method of manufacturing a circuit protection device of claim 4, wherein the first external electrodes are formed to be connected to some of the internal electrodes of the common mode noise filter and the internal electrodes of the ESD protection device, and the second external electrodes are formed to be connected to some of the internal electrodes of the ESD protection device.

6. The method of manufacturing a circuit protection device of claim 5, wherein the ESD protection material is formed from a mixture in which an organic material is mixed with at least one conductive material selected from $RuO_2$, Pt, Pd, Ag, Au, Ni, Cr, W and the like.

7. The method of manufacturing a circuit protection device of claim 6, wherein the ESD protection material is formed by further mixing a varistor material or an insulating ceramic material with the mixture.

8. A method of manufacturing a circuit protection device, comprising:
forming a coil pattern optionally surrounding a magnetic material on a plurality of nonmagnetic sheets and forming an internal electrode connected to the coil pattern to prepare a common mode noise filter;
filling an ESD protection material in a hole optionally formed on the plurality of nonmagnetic sheets and forming an internal electrode connected to the ESD protection material to prepare an ESD protection device; and
laminating the common mode noise filter with the ESD protection device.

9. The method of manufacturing a circuit protection device of claim 8, wherein the common mode noise filter has holes formed to pass through each of the plurality of sheets, and the magnetic material is filled in the holes.

10. The method of manufacturing a circuit protection device of claim 9, wherein the ESD protection material is formed from a mixture in which an organic material is mixed with at least one conductive material selected from $RuO_2$, Pt, Pd, Ag, Au, Ni, Cr, W and the like.

* * * * *